(12) United States Patent
Akhavan et al.

(10) Patent No.: US 11,869,728 B2
(45) Date of Patent: Jan. 9, 2024

(54) ROLLED HETERO-STRUCTURES AND METHOD OF MANUFACTURING ROLLED HETERO-STRUCTURES

(71) Applicant: CAMBRIDGE ENTERPRISE LIMITED, Cambridge (GB)

(72) Inventors: Shahab Akhavan, Cambridge (GB); Amin Taheri Najafabadi, Cambridge (GB); Ilya Goykhman, Haifa (IL); Luigi Occhipinti, Cambridge (GB); Andrea Carlo Ferrari, Cambridge (GB)

(73) Assignee: CAMBRIDGE ENTERPRISE LIMITED, Cambridge (GB)

( * ) Notice: Subject to any disclaimer, the term of this patent is extended or adjusted under 35 U.S.C. 154(b) by 11 days.

(21) Appl. No.: 17/617,671

(22) PCT Filed: Apr. 29, 2020

(86) PCT No.: PCT/EP2020/061906
§ 371 (c)(1),
(2) Date: Dec. 9, 2021

(87) PCT Pub. No.: WO2020/221804
PCT Pub. Date: Nov. 5, 2020

(65) Prior Publication Data
US 2022/0172905 A1    Jun. 2, 2022

(30) Foreign Application Priority Data
Apr. 30, 2019   (GB) ..................... 1906049

(51) Int. Cl.
*H10K 30/30*   (2023.01)
*H10K 30/53*   (2023.01)
(Continued)

(52) U.S. Cl.
CPC ......... *H01G 9/2086* (2013.01); *G01N 27/125* (2013.01); *H01G 9/0036* (2013.01);
(Continued)

(58) Field of Classification Search
CPC ......... H10K 10/462–491; H10K 30/53; H10K 30/65; H10K 50/182
See application file for complete search history.

(56) References Cited

U.S. PATENT DOCUMENTS

| 2005/0040374 A1* | 2/2005 | Chittibabu | ............. D02G 3/441 |
| | | | 257/E31.038 |
| 2005/0227059 A1* | 10/2005 | Granstrom | ............ D06M 15/63 |
| | | | 428/292.1 |
| 2015/0029607 A1 | 1/2015 | Lee et al. | |

FOREIGN PATENT DOCUMENTS

| CN | 106811967 A | 6/2017 |
| CN | 107780264 A | 3/2018 |

(Continued)

OTHER PUBLICATIONS

Liu, Single-layer graphene sheets as counter electrodes for fiber-shaped polymer solar cells, RSC Advances, 2013, 3, 13720, pp. 13720-13727 and Suppl. Materials pp. 1-5 (Year: 2013).*

(Continued)

*Primary Examiner* — Daniel P Shook
(74) *Attorney, Agent, or Firm* — TAROLLI, SUNDHEIM, COVELL & TUMMINO L.L.P.

(57) ABSTRACT

We disclose herein a hetero-structure comprising: a curved material; at least one layer of a first material rolled around the curved material; at least one intermediate layer rolled on the at least one layer of the first material; and at least one layer of a second material rolled around the at least one intermediate layer.

24 Claims, 13 Drawing Sheets

(51) Int. Cl.
  *H10K 30/65*  (2023.01)
  *H10K 50/135*  (2023.01)
  *H10K 50/10*  (2023.01)
  *H10K 71/12*  (2023.01)
  *H01G 9/20*  (2006.01)
  *G01N 27/12*  (2006.01)
  *H01G 9/00*  (2006.01)

(52) U.S. Cl.
  CPC ........... *H01G 9/2009* (2013.01); *H10K 30/30* (2023.02); *H10K 30/53* (2023.02); *H10K 30/65* (2023.02); *H10K 50/135* (2023.02); *H10K 50/182* (2023.02); *H10K 71/12* (2023.02)

(56) References Cited

FOREIGN PATENT DOCUMENTS

| | | |
|---|---|---|
| GB | 1555015 A | 11/1979 |
| JP | 0649769 | 4/1995 |

OTHER PUBLICATIONS

Search Report for GB1906049.0 dated Mar. 19, 2020.
Search Report-2 for GB1906049.0 dated Aug. 19, 2019.
Zoumpoulidis, et al.: "Deformable Silicon Electronics Using Segmentation and Flexible Interconnect"; 2007 Proceedings 57th Electronic Components and Technology Conference. IEEE, 2007.
Dianyi Liu, et al., "Single-layer graphene sheets as counter electrodes for fiber-shaped polymer solar cells", RSC Advances, vol. 3, No. 33, Apr. 14, 2013, p. 13720, XP055718655.
Seungmin Lee, et al., "Multilayered Graphene Electrode using One-Step Dry Transfer for Optoelectronics", Current Optics and Photonics, vol. 1, No. 1, Feb. 25, 2017, pp. 7-11, P055718657.
Yu Wu, "Optical Graphene Gas Sensors", Based on Microfibers: a Review, SENSORS, vol. 18, No. 4, Mar. 3, 2018, p. 941, XP055718663.
International Search Report and Written Opinion for corresponding PCT Application No. PCT/EP2020/061906 dated Apr. 29, 2020.
International Preliminary Report on Patentability for corresponding PCT Application No. PCT/EP2020/061906 dated Apr. 29, 2020.

* cited by examiner

ROLLED HETERO-STRUCTURES AND METHOD OF MANUFACTURING ROLLED HETERO-STRUCTURES

RELATED APPLICATIONS

The present invention is a U.S. National Stage under 35 USC 371 patent application, claiming priority to Serial No. PCT/EP2020/061906, filed on Apr. 29, 2020; which claims priority from GB Patent Application No. 1906049.0, the entirety of both are incorporated herein by reference.

INTRODUCTION

The present invention relates to a hetero-structure and a method of manufacturing a hetero-structure. The present invention also relates to a method of depositing one or more layers of a first material on a fiber, wherein a sheet of the first material is provided in a liquid and the sheet is then transferred out of the liquid and rolled onto the fiber. The invention also relates to use of rolling to deposit layers of a CVD material (e.g. graphene) on a fiber, with transfer support substrates, and to fibers obtained from the processes. Fibers comprising a core and a plurality of layers of a first material also form part of the invention as well as articles (e.g. wearable articles) and devices comprising the fiber.

BACKGROUND

Wearable electronics, such as smart textiles or e-textiles, are major fields of interest for this invention due to their potential applications in multiple industrial sectors, including healthcare monitoring, consumer electronics, energy harvesting and storage, and sensing. To satisfy commercial demands, e-textiles must integrate one or more functionalities among electrical and electronic passive and active devices, photonic and optoelectronics, sensing, energy harvesting and storage, and be comfortable to wear, lightweight, mechanically flexible and resistive to deformation such as bending, induced tension and compression.

A growing body of research describes the hybrid integration of conventional electronics (i.e. silicon-based integrated circuits) into flexible substrates including textiles. However, high fabrication cost, lack of compatibility with textile manufacturing process, difficult maintenance, mechanical rigidity (i.e. intolerance to various forms of mechanical stress such as bend, fold, twist or deform) and lack of bio- or skin compatibility of the devices remain challenging.

It is known that if all the electronic functionalities can be provided in the fiber form factor, the fiber can then readily be used for the manufacture of smart or e-textiles for adoption in wearable electronics and other applications. Consequently, fibers with different functionalities (i.e. conductive, semi conductive, photoactive, light emitting etc.) have been described and, in some cases, have been integrated into textiles using conventional textile manufacturing processes, such as weaving. Conductive polymers are promising candidates for wearable electronics due to their electrical and optical properties. One of the most promising types of polymer for flexible and wearable electronics is poly-(3,4-ethylenedioxythiophene) (PEDOT) which has high conductivity and solution processability. Other polymers and pi-conjugated organic molecules have also been investigated. For instance, polypyrrole nanofibers (60-100 nm in average diameter) with relatively high conductivity of 120-130 S/cm have been prepared. However, these polymers and organic molecules suffer from stability issues and tend to appear with a bluish tint, which limits their applications in wearable light emitting diodes (LEDs) and solar cells.

Metallic nanowires (or nanoparticles) have also been explored for fiber-based wearable electronics due to their high conductivities. Porous fibers filled with silver flakes and nylon fibers coated with silver using electroless plating are examples. However, surface roughness, stability (especially for nanoparticles) and safety issues regarding the biocompatibility of metal ions were identified as the main drawbacks of these materials.

Utilizing aforementioned materials, devices such as fiber organic filed effect transistor (OFET), wire electrochemical transistors (WETC), and phototransistors are demonstrated in prior art. OFET configurations are shown to be sensitive against the gate insulator thickness, channel length and surface roughness; which can cause short circuit. On the other hand, WETCs are far less affected by local geometry and their relative ease of manufacturing makes them more attractive for practical applications. Their main drawback however is the slow response time, which results in low switching frequency due to the electro-diffusion of ions within the solid electrolyte where the ionic charges exhibit sub-par mobility. Moreover, fiber photodetectors are made by directly bonding a photodetector onto a fiber facet (fiber end-face) with limited responsivity of 0.6 A/W at 4 V and 400 nm wavelength with rise and fall times of 7.1 s and 3.5 s, respectively. Therefore, developing more advanced materials is one of the main bottlenecks towards improving the conductivity, mobility and enabling more novel device architectures to achieve higher performance.

Over the past decade, graphene has emerged as a promising material due to its high electrical conductivity, low-dimensional thickness, conformability to curved surfaces with low radius of curvature, flexibility and chemical stability. Some conductive textiles based on graphene have been reported in prior art. Conductive graphene fibers made of reduced graphene oxide (RGO) or a mixture of RGO and carbon nanotubes have, for instance, been produced. However, the resulting fiber shows high roughness/stiffness and lack of performance, and does not meet the mechanical and electrical requirements needed for wearable electronics applications.

Liquid phase exfoliated (LPE) graphene has also been investigated as an alternative graphene production route to fabricate channel material in transistors or as electrodes in optoelectronic applications due to its improved intrinsic properties, environmental stability and low cost. However, poor charge carrier mobility of the resulting films seems to be a major problem preventing the wide spread use of LPE graphene in wearable electronics. Additionally, to reach the electrical performance required for large scale applications the transparency and flexibility of the films is seriously compromised.

Chemical vapor deposition (CVD) is known as a preferred method for producing large area, high quality, monolayer, graphene. With the recent advances in CVD technologies, roll-to-roll production of up to 30" flexible graphene films on Cu substrate with low sheet resistances, high optical transparency and high field effect mobility has been reported.

SUMMARY OF INVENTION

Viewed from a first aspect the present invention provides a method of depositing one or more layers of a first material on a fiber comprising:

(i) providing a sheet of the first material in a liquid;
(ii) fishing the sheet of the first material out of the liquid onto a transfer support;
(iii) transferring the sheet of the first material from the transfer support onto the fiber by rolling the fiber; and
(iv) optionally cutting the sheet of the first material.

Viewed from a further aspect the present invention provides a method of depositing one or more layers of a first material on a fiber comprising:
(a-i) providing a sheet of the first material on a support;
(b-i) removing the sheet of the first material from its support by chemical etching or electrochemical delamination;
(i) placing the sheet of the first material in a liquid;
(ii) fishing the sheet of the first material out of the liquid onto a transfer support;
(iii) transferring the sheet of the first material from the transfer support onto the fiber by rolling the fiber;
(iv) optionally removing protective film from the surface of the first material; and
(v) optionally cutting the sheet of the first material.

Viewed from a further aspect the present invention provides the use of one or more of the aforementioned methods to transfer the first material out of the liquid onto the fiber, wherein the process is adapted for continuous manufacturing by means of the following adaptations:
i) the transfer support in made of a roll partially immersed in the solution and rotating continuously to fish the sheet of the first material out of the liquid on the fiber;
ii) the fiber is pulled from one end by inducing a continuous rotational movement along its main axis that allow one or more layers of the first material to be transferred from the transfer support to the surface of the fiber.

Viewed from a further aspect the present invention provides a method of depositing one or more layers of a first material on a fiber, preferably a polymeric fiber, comprising:
(1) providing a sheet of CVD material (e.g. graphene) on a support, preferably metal support, wherein said CVD material is protected by a film;
(2) removing the sheet of CVD material (e.g. graphene) from its support, preferably metal support, by chemical etching or electrochemical delamination;
(3) placing the sheet of CVD material (e.g. graphene) in a liquid, preferably an aqueous solution;
(4) fishing the sheet of the CVD material (e.g. graphene) out of the liquid and onto a transfer support;
(5) transferring the sheet of the CVD material (e.g. graphene) from the transfer support onto the fiber by rolling the fiber;
(6) optionally removing the protective film from the surface of the CVD material by dissolution in a solvent; and
(7) optionally cutting the sheet of the first material.

Viewed from a further aspect the present invention provides the use of rolling to deposit layers of a CVD material (e.g. graphene) on a fiber, wherein during said rolling a sheet of the CVD material is transferred from a transfer support to the fiber.

Viewed from a further aspect the present invention provides a fiber obtainable by the process hereinbefore described.

Viewed from a further aspect the present invention provides a fiber comprising:
(i) a core fiber comprising a polymer, glass or metal; and
(ii) a plurality of layers of a first material, wherein each layer has a thickness of <500 nm.

Viewed from a further aspect the present invention provides an article comprising a fiber as hereinbefore described.

Viewed from a further aspect the present invention provides a device comprising a fiber as hereinbefore described.

Viewed from a further aspect of the present invention provides a hetero structure comprising:
a curved material;
at least one layer of a first material rolled around the curved material;
at least one intermediate layer rolled or formed on the at least one layer of the first material; and
at least one layer of a second material rolled around the at least one intermediate layer.

Viewed from a further aspect the present invention provides a method of manufacturing a hetero-structure, the method comprising:
forming a curved material;
rolling at least one layer of a first material around the curved material;
forming or rolling at least one intermediate layer on the at least one layer of the first material; and
rolling at least one layer of a second material rolled around the at least one intermediate layer.

Definitions

As used herein the term "fiber" refers to a thread-like structure which has a length that is significantly longer than its width. Typical fibers have a length that is at least two times longer than its width. The term "fiber" also refers to a curved material of the hetero-structure device.

As used herein the term "sheet" refers to a continuous area of a material, that has a length and width that is substantially larger than its thickness. The "sheet" referred to herein optionally comprises a plurality of layers.

As used herein the term "layer" refers to a continuous coating of substantially uniform thickness. The term "at least one layer" refers to one or more layers.

As used herein the term "transfer support" refers to a substrate or carrier that is used to temporarily support the sheet and/or fiber. Preferably the sheet of first material is removed from a liquid onto the surface of the transfer support and thereafter the sheet of first material is rolled around the fiber.

As used herein the term "fishing" refers to the process of removing the sheet of material from a liquid and onto the surface of the transfer support.

As used herein the term "rolling" encompasses turning as well as twisting. Turning may be continuously in the same direction or may include changing direction. The term "rolled around" refers to wrapping around as well.

As used herein the term "intermediate layer" refers to both dielectric layers (when considering a phototransistor and/or a sensing device) and semiconducting intermediate layers, e.g. a hole transport layer and/or a photoactive layer (when considering a solar cell and/or LED device).

DETAILED DESCRIPTION OF INVENTION

The present invention relates to a method of depositing one or more layers of a first material on a fiber. The method comprises:
(i) providing a sheet of the first material in a liquid;
(ii) fishing the sheet of the first material out of the liquid and onto a transfer support;
(iii) transferring the sheet of the first material from the transfer support onto the fiber by rolling the fiber; and
(iv) optionally cutting the sheet of the first material.

It is challenging to reliably and consistently deposit layers of material on fibers due to the structure of fibers. Fibers typically have a significantly greater length than width. Preferred fibers used in the method of the present invention have a length that is 1-10,000 times, more preferably 100-10,000 times and still more preferably 1000-10,000 times greater than the width of the fiber. Preferred fibers used in the method of the invention have a length of 0.1-100 cm, more preferably 0.1-10 cm and still more preferably 0.1-10 mm. Preferred fibers used in the method of the invention have a width of 0.1-5 cm, more preferably 0.1-1 cm and still more preferably 0.1-1 mm.

The fibers used in the methods of the present invention preferably have a substantially round or curved (e.g. circular) cross section. Alternatively, however, a bundle of fibers may be used in the method of the present invention. In this case, the individual strands are referred to as filaments and the bundle of filaments is referred to as the fiber. In this case the layer of first material is deposited on the outer surface of the fiber formed by the bundle of filaments. The fiber form of the fiber used in the method of the present invention is not significant. For example, fibers which are spun, twisted or, as previously described, multi-filament may be employed.

In preferred methods of the invention the fiber is an insulator, conductor, or semiconductor. Preferably the fiber is an insulator.

Preferably the fiber used in the methods of the invention comprises, e.g. consists of, a polymer, glass, carbon, metal or a mixture thereof. More preferably the fiber comprises, e.g. consists of, polymer, glass, metal or a mixture thereof and still more preferably the fiber comprises a polymer. Representative examples of suitable polymers include nylon, cotton, silk, rattan, jute, polyester, polylactic acid (PLA), acrylic, aramid, polyamide, polyolefin, polyphenylene sulfide, polystyrene, wool, acetate, diacetate, triacetate and glass fibers. Representative examples of metals include steel, aluminium, magnesium, copper, molybdenum and tungsten.

In preferred methods of the invention the sheet of first material comprises an electrically conducting material. Preferably the sheet of first material is a chemical vapour deposited (CVD) material or a physical vapour deposited (PVD) material, preferably a chemical vapour deposited (CVD) material. CVD and PVD advantageously provide materials of high quality. For instance, CVD graphene can be provided in the form of a monolayer, with low sheet resistance, high optical transparency and high field effect mobility.

In preferred methods of the present invention the sheet of first material comprises, and more preferably consists of, graphene, boron nitride, transition metal dichalcogenides, dopant structures, a binary alloy or a ternary alloy. Representative examples of suitable transition metal dichalcogenides include $MoS_2$, $MoSe_2$, $WSe_2$, $WS_2$ as well as heterostructures of transition metal dichalcogenides such as $MoS_2$—$MoSe_2$ and $MoSe_2$—$WSe_2$. Representative examples of suitable binary alloys include $MoS_{2x}Se_{2(1-x)}$. Representative examples of ternary alloys (i.e., $MoS_{2(1-x)}Se_{2x}$—$WS_{2(1-x)}Se_{2x}$). Preferably, however, the sheet of first material comprises, and more preferably consists of, graphene. Optionally the graphene is doped and/or functionalised (e.g. with amine groups, epoxide groups, iron oxide etc).

In preferred methods of the present invention the sheet of first material is a monolayer and more preferably a graphene monolayer. Preferably the thickness of the sheet of first material is 0.3-50,000 nm, more preferably 0.3-1000 nm and still more preferably 0.3-1 nm.

In preferred methods of the present invention the sheet of first material is protected with a protective film. Preferably the protective film covers one surface of the sheet of first material. Preferably the protective film comprises a polymer. Preferably the protective film survives (i.e. is not damaged or changed by) the fishing and transferring steps of the method of the invention. Thus, preferably the protective film is not soluble in the liquid in which the sheet of first material is placed.

Preferably the protective film comprises, e.g. consists of, poly(methyl methacrylate) (PMMA) poly(bisphenol A carbonate) (PC), polyvinylchloride (PVC), polyvinyl alcohol (PVA), polyvinylpyrrolidone (PVP), ethylene-vinyl acetate (EVA) and polydimethylsiloxane (PDMS). The protective film may be deposited by any conventional method in the art, e.g. spin coating. Preferably the thickness of the protective film on the sheet of first material is 1-10,000 nm, more preferably 10-1,000 nm and still more preferably 100-500 nm. In preferred methods of the invention the total thickness of the sheet of first material and the protective film is 1-10,000 nm, more preferably 10-1,000 nm and still more preferably 100-500 nm.

Further preferred methods of the present invention comprise the step of providing a sheet of the first material, optionally with a protective film, on a support and removing the sheet of the first material from the support. Preferred supports include metal (e.g. copper) and sapphire. Protective film-coated single layer materials (e.g. graphene) on metal supports are commercially available. For example PMMA-coated single layer graphene on a copper support is commercially available from Graphenea. A cross section of the structure would show the first material (e.g. graphene) is sandwiched between an overlying protective film and an underlying support.

Preferred methods of the invention further comprise a step of removing the support from the sheet of first material by chemical etching or electrochemical delamination. This produces a free standing sheet of first material. The methods are conventional in the art. Thus, for example, if chemical etching is utilised, the support may be dissolved by placing it in a suitable chemical bath (e.g. aqueous ammonium persulfate or HCl if the support is copper). If electrochemical delamination is used, a copper support may be removed using an electrochemical cell with the support as the cathode and applying a voltage. The method chosen should ensure that any protective film present on the sheet of first material will not be damaged or changed during the step of removing the support from the sheet of first material.

In preferred methods of the invention the sheet of first material is washed after any step to remove a support therefrom. Preferably the sheet of first material is washed with water, preferably deionsied water, e.g. by dipping or spraying. Optionally the sheet of first material is dried.

In preferred methods of the present invention the sheet of first material is placed in a liquid. This is to enable the fishing and transferring steps of the method of the invention to be carried out. A preferred method of the invention comprises:

(a-i) providing a sheet of the first material on a support;
(b-i) removing the sheet of the first material from its support by chemical etching or electrochemical delamination;
(i) placing the sheet of the first material in a liquid;
(ii) fishing the sheet of the first material out of the liquid and onto a transfer support;

(iii) transferring the sheet of the first material from the transfer support onto the fiber by rolling the fiber;

(iv) optionally removing protective film from the surface of the first material; and (v) optionally cutting the sheet of the first material.

In the methods of the present invention the sheet of first material is fished out the liquid onto a transfer support. Preferably the sheet of first material floats in the liquid. Preferably the transfer support is dipped into the liquid, underneath the sheet of first material, so that the support may be brought into contact with the surface of the first material. If the sheet of first material comprises a protective film, preferably the sheet is oriented in the liquid so that the side of the sheet protected by the protective film is uppermost. In preferred methods of the invention, the transfer support is brought into contact with the sheet of first material by lifting the transfer support underneath the sheet of first material so that the sheet of first material is caught or trapped on its surface. Preferably the transfer support, with the sheet of first material, on its surface is at least partially, optionally completely, lifted out of the liquid.

In preferred methods of the invention, prior to bringing the sheet of first material into contact with the transfer support, the fiber is placed across the transfer support and more preferably across the top edge of the transfer support. In further preferred methods of the invention, the transfer support and the sheet of first material, where the fiber is present, are aligned during the fishing step. Thus, still more preferably the top edge of the transfer support and the top edge of the sheet of first material, where the fiber is present, are aligned during the fishing step Thus in preferred methods the fishing step brings the sheet of first material directly into contact with the fiber. Alternatively, the sheet of first material may be slid along the surface of the transfer support until it contacts the fiber. Optionally the sliding of the sheet of first material into contact with the fiber may be carried out once the transfer support is lifted out of the liquid.

Subsequent rolling of the fiber causes the sheet of first material to slide along the transfer support and, simultaneously, to roll around the fiber. The rolling may be carried out at any suitable speed. Some typical speeds include 0.1-100 rpm, more preferably 0.1-50 rpm and still more preferably 0.1-10 rpm. Rolling is carried out using 10 conventional equipment.

The sliding motion of the sheet of first material along the transfer support preferably causes stretching of the first sheet of material. This means that it is wrinkle and crease free when it rolls around the fiber. The rolling of the fiber causes layers of first material to form on the fiber in a controlled manner. The thickness of each layer corresponds to the thickness of the sheet of first material. Advantageously the layers substantially conform to the shape of the fiber. Additionally, due to the stretching that occurs, there are few, if any, wrinkles or creases, in the layers formed.

In preferred methods of the present invention a plurality of layers of first material is deposited on the fiber by rolling the fiber. In further preferred methods of the invention 1-1000 layers, more preferably 1-100 layers and still more preferably 1-10 layers of first material are deposited on the fiber. The number of layers can readily be controlled by knowledge of the degree of rotation. Alternatively, if the circumference of the fiber is known, the number of layers can be controlled by the length of the sheet of the first material.

The present invention therefore also relates to the use of rolling to deposit layers of a CVD material (e.g. graphene) on a fiber, wherein during said rolling a sheet of the CVD material is transferred from a transfer support to the fiber. Preferred fibers are as hereinbefore described.

The surface of the transfer support plays a key role in the methods and uses of the invention. The surface of the transfer support must have suitable properties to enable a sheet of first material to adhere thereto, e.g. so the sheet will transfer onto the support and be lifted out of the liquid on the surface thereof. On the other hand, the surface of the transfer support must allow the sheet of first material to slide so that when the fiber is rolled, facile transfer onto the fiber occurs.

In preferred methods and uses of the present invention, the transfer support comprises polyethylene terephthalate (PET), polyethylene naphthalate (PEN), quartz, or glass. Optionally the transfer support is surface treated, preferably plasma treated or chemically treated. The surface treatment may, for example, be used to increase the lubricity and/or reduce the friction of the surface. The choice of transfer support depends, inter alia, on the liquid used in the fishing step.

In preferred methods and uses of the invention the contact angle between the surface of the transfer support and the liquid is 10-80°, more preferably 15-70° and still more preferably 20-50°. At these contact angles, the transfer support can be wetted in the liquid and this encourages the sheet of first material to slide thereon.

The liquid used in the methods and uses of the present invention preferably has a surface tension of 10-100 mN/m, more preferably 15-90 mN/m and still more preferably 20-50 mN/m. Preferred liquids are selected from water, $C_{1-6}$ alcohol, and mixtures thereof. One preferred method of the invention employs a PET or PEN transfer support and water as the liquid. Another preferred method of the invention employs glass as the transfer support and isopropanol as the liquid.

Further preferred methods of the invention comprise a further step of removing protective film from the surface of the first material. In preferred methods the protective film is removed by dissolution in a solvent. Representative examples of suitable solvents include ketones (e.g. acetone), ethers (e.g. diethylether) and chlorobenzene. Advantageously the protective film on the surface of the first material may be removed by dissolution even when it is not present on the outer surface, i.e. when it is present on the interior of the layers of first material due to subsequent rolling overlying a further layer of first material. In preferred methods of the invention, the layer(s) of first material on the fiber shrink when the protective film is removed. Advantageously the shrinking increases the level of conformity of the layer(s) with the fiber structure.

Alternatively, the method of the present invention may comprise a further step of modifying the protective polymer, e.g. to provide specific functionality in the layer(s).

Optionally the sheet of first material is cut after the necessary layers of first material have been deposited. Cutting of the sheet of first material is preferably carried out if the sheet of first material is longer than is needed to deposit the number of layers on the fiber that is required. Cutting may be carried out by using a sharp blade, using a laser beam or by pulling the sheet.

In a particularly preferred method of the invention one or more layers of a first material are deposited on a fiber, preferably a polymeric fiber, comprising:

(i) providing a sheet of CVD material (e.g. graphene) on a metal support, wherein one surface of said CVD material is protected by a film;

(ii) removing the sheet of CVD material (e.g. graphene) from its metal support by chemical etching or electrochemical delamination;
(iii) placing the sheet of CVD material (e.g. graphene) in a liquid, preferably an aqueous solution;
(iv) fishing the sheet of the CVD material (e.g. graphene) out of the liquid and onto a transfer support, preferably a PEN or PET transfer support;
(v) transferring the sheet of the CVD material (e.g. graphene) from the transfer support onto the fiber by rolling the fiber;
(vi) removing the protective film from the surface of the CVD material by dissolution in a solvent; and
(vii) optionally cutting the sheet of the first material.

In further preferred methods of the invention, a layer of second material is deposited on top of the first material. The second material is preferably a dielectric, an insulator, a conductor or a semi-conductor. Preferably the second material is a dielectric. The layer of second material may be deposited by the method herein described, i.e. by performing steps (i)-(v) described above. Alternatively, the layer of second material may be deposited by any method conventional in the art, e.g. spin coating, deposition etc.

In particularly preferred methods of the invention a further layer of the first material is deposited on top of the second material by repeating steps (i)-(v) described above. Advantageously the methods of the present invention may be used to build hetero-structures.

The present invention also relates to a fiber obtainable by the processes hereinbefore described.

The fiber according to the present invention is a coated fiber. It comprises a core which derives from the starting material fiber and a coating which comprises a number of layers of a first material. Thus, the fiber, preferably a coated fiber, comprises:
(i) a core comprising a polymer, glass or metal; and
(ii) a plurality of layers of a first material, wherein each layer has a thickness of <500 nm.

Preferred fibers comprise a core comprising a polymer. Preferred polymers are as hereinbefore described in relation to the method. Preferred first materials are those as hereinbefore described in relation to the method.

Preferred fibers comprise 1-1000 layers, more preferably 1-100 layers and still more preferably 1-10 layers. The total thickness of the layers of first material is preferably 1-10,000 nm, more preferably 10-1,000 nm and still more preferably 100-500 nm.

Further preferred fibers comprise one or more layers of dielectric, semiconductor, photoactive compound, light emitting compound or insulator. Yet further preferred fibers comprise a further (e.g. second) plurality of layers of first material.

The present invention also relates to articles and devices comprising a fiber of the present invention. Articles include woven articles. Representative examples of wearable articles include healthcare (monitoring heart rate or other vitals) [Advanced Materials 28, 4373 (2016)], wearable displays [Nature communications 6, 7149 (2015)] and energy harvesting [Advanced Materials 27, 4830 (2015)] applications.

The present invention also relates to a hetero-structure comprising:
a curved material;
at least one layer of a first material rolled around the curved material;
at least one intermediate layer formed on the at least one layer of the first material; and
at least one layer of a second material rolled around the at least one intermediate layer.

It will be apparent to the skilled person that the hetero-structure covers a wide range of devices such as LED, solar cell, sensors, and/or phototransistors. The ability of the first and second materials being rolled over one another is particularly advantageous as it makes them suitable for wearable electronics. The hetero-structure is generally suitable for use on weaved fibres.

The curved material may comprise a fibre comprising glass, metal, carbon, nylon, polyester, cotton wools or a mixture thereof.

The first and second materials may each comprise an electrically conducting material.

At least one of the first and second materials may comprise graphene, boron nitride, transition metal dichalcogenides, dopant structures, a binary alloy or a ternary alloy.

Preferably, at least one of the first and second materials comprises chemical vapour deposition (CVD) or physical vapour deposition (PVD) single layer graphene (SLG).

Preferably, the first material comprises a plurality of rolled layers, and wherein the second material comprises a plurality of rolled layers. It will be understood that the rolled layers for each of first and second materials can be of any suitable numbers.

Preferably, the first material comprises at least six layers rolled on top of one another, and wherein the second material comprises one to six layers rolled on top of one another. It will be understood that the present disclosure is not restricted to six rolled layers, but it can be any rolled numbers as necessary.

It will be appreciated that the present disclosure covers various hetero-structures made of graphene and other two-dimensional materials. These types of hetero-structure are suitable for mass production and environmentally friendly for manufacturing.

Preferably, the at least one intermediate layer is an insulation layer.

Preferably, the at least one intermediate layer comprises separate or a mixture of aluminium oxide ($Al_2O_3$) and a conformal coating of pin-hole-free Parylene C. Advantageously, Parylene is a reliable dielectric material with promising prospects for flexible electronics. Since Parylene C is applied as gas and evaporated at ambient temperature under vacuum, it ultimately covers all the available surfaces, providing complete and uniform encapsulation. Consequently, this step further improves the dielectric robustness against deformations during manufacturing and significantly reduces the risk of short circuit.

The at least one layer of the first material may be configured to operate as a gate region and the at least one layer of the second material is configured to operate as a channel region.

The hetero-structure may further comprise a source region and a drain region located on the at least one layer of the second material, the channel region being located between the source and drain regions.

The hetero-structure may further comprise a photoactive material located on the channel region.

The photoactive material may comprise a doped perovskite solution.

The hetero-structure may be a gas sensing device. The gas sensing device may be configured to detect a gas by detecting a change in resistance of the channel region.

The hetero-structure may be a phototransistor.

The at least one intermediate layer may comprise a plurality of semiconducting layers.

The plurality of semiconducting layers may comprise a hole transport layer and a photoactive layer over the hole transport layer.

The hetero-structure may further comprise a first electrode disposed on the at least one layer of the first material and a second electrode disposed on the at least one layer of the second material.

The hetero-structure may be a light emitting diode (LED).

The hetero-structure may be a solar cell.

The hetero-structure may be an imaging sensor and/or an ultraviolet (UV) detector.

The hetero-structure may be a strain sensor.

The hetero-structure may be an actuator.

The hetero-structure interior may act as an optic coupler.

A rolled device may incorporate the hetero-structure as described above.

The present disclosure also relates to a method of manufacturing a hetero-structure, the method comprising:
forming a curved material;
rolling at least one layer of a first material around the curved material;
forming or rolling at least one intermediate layer on the at least one layer of the first material; and
rolling at least one layer of a second material around the at least one intermediate layer.

The versatility of the method of the invention has been demonstrated by applying it to manufacture a wide range of devices such as LEDs, solar cells, phototransistors, gas sensors, image sensors, UV detectors and other types of sensors.

Generally speaking, the combination of conductors, semiconductors and insulators with well-defined geometries and intimate interface is used in fiber-based electronics. In one example, graphene plays a key role with excellent electronic (i.e., high conductivity, work function tunability via gating) and mechanical (i.e., bending and conformity) properties. Consequently, a gate tunable hybrid graphene/perovskite fiber phototransistor is constructed with broad photo-detection spectral range from visible to near infrared (870 nm) and high external responsivity (22,000 A/W) at only 1V operating voltage range. SLG obtained from CVD is first delaminated and then rolled on top of the fiber of interest (6 rolls). A facile two-step dielectric deposition process may follow this before rolling another CVD SLG as the channel layer. After, for example, inkjet printing the source and drain, a doped state-of-the-art perovskite solution is deposited on top of the channel layer as the photoactive material. Such phototransistor is sensitive to illumination along its entire channel length (1 mm). The effect of graphene's gate tunability on the device performance is investigated along with extensive mechanical testing and standard washability procedures to investigate the durability of fibers. Graphene's conformality to roll around the fiber along with low operating voltages (<1V) play a critical role towards large scale implementation in wearable electronics.

The invention will now be described in detail with reference to the following Figures and Examples wherein.

Figure 6:
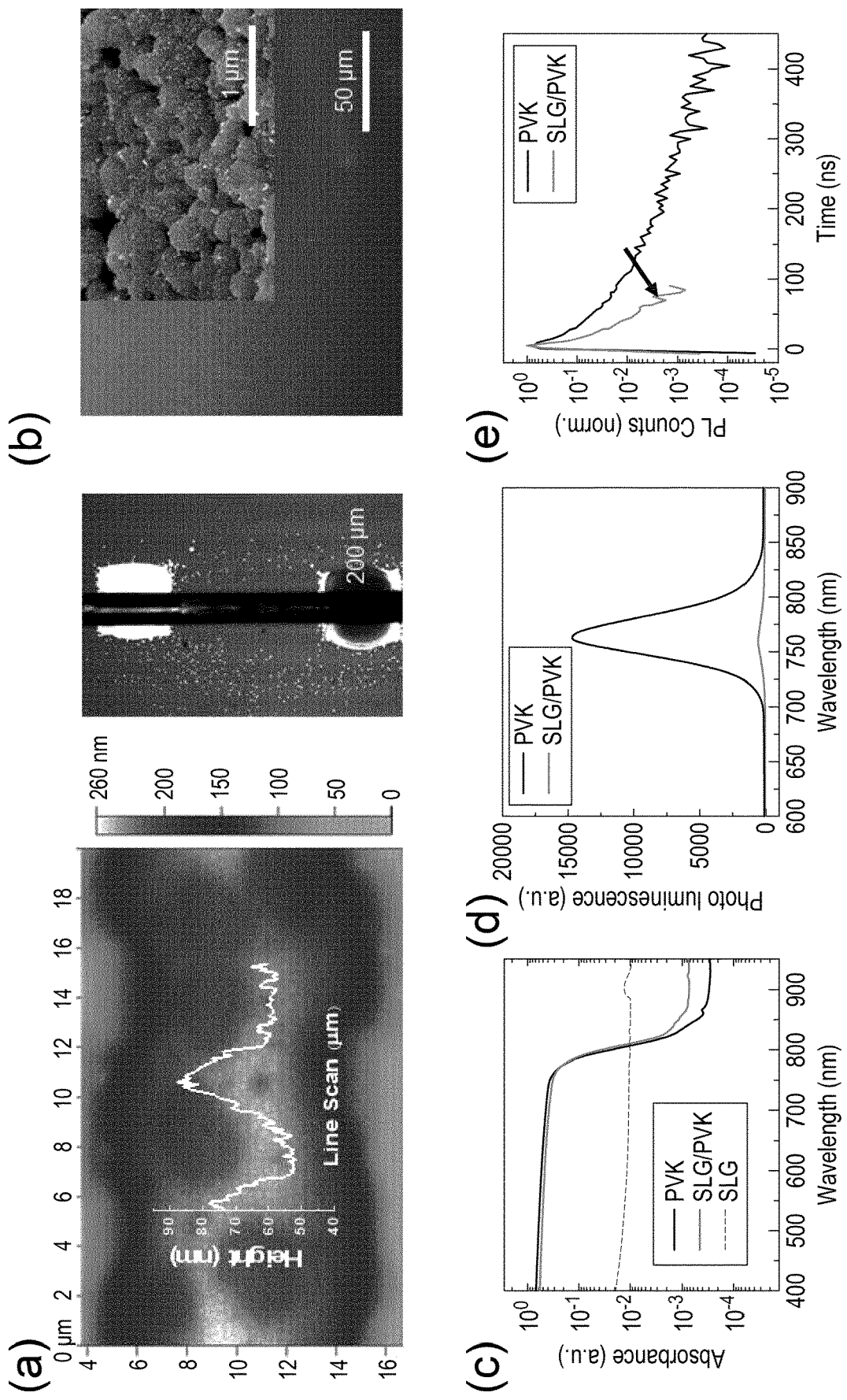
Figure 7:
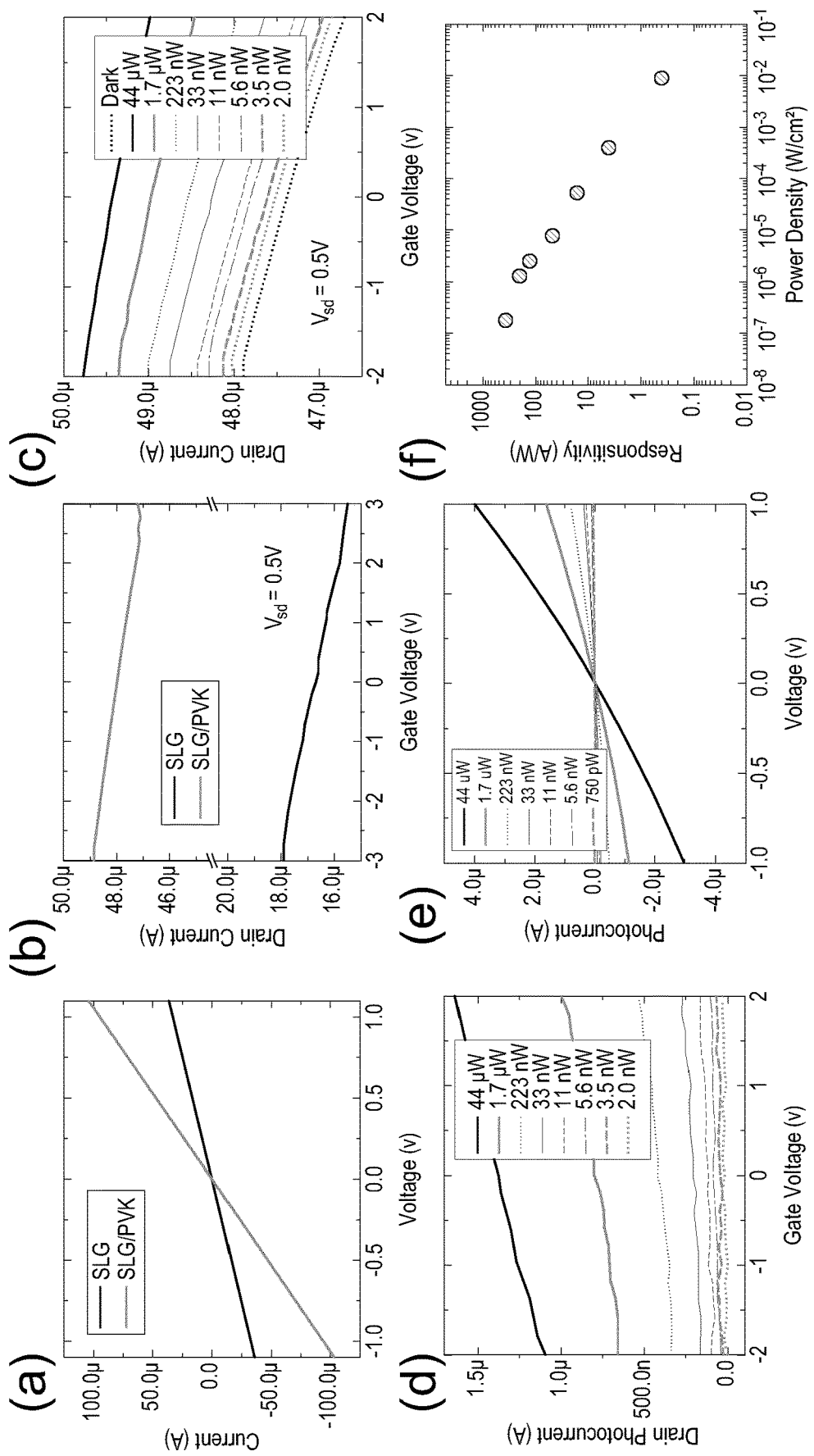
Figure 8:
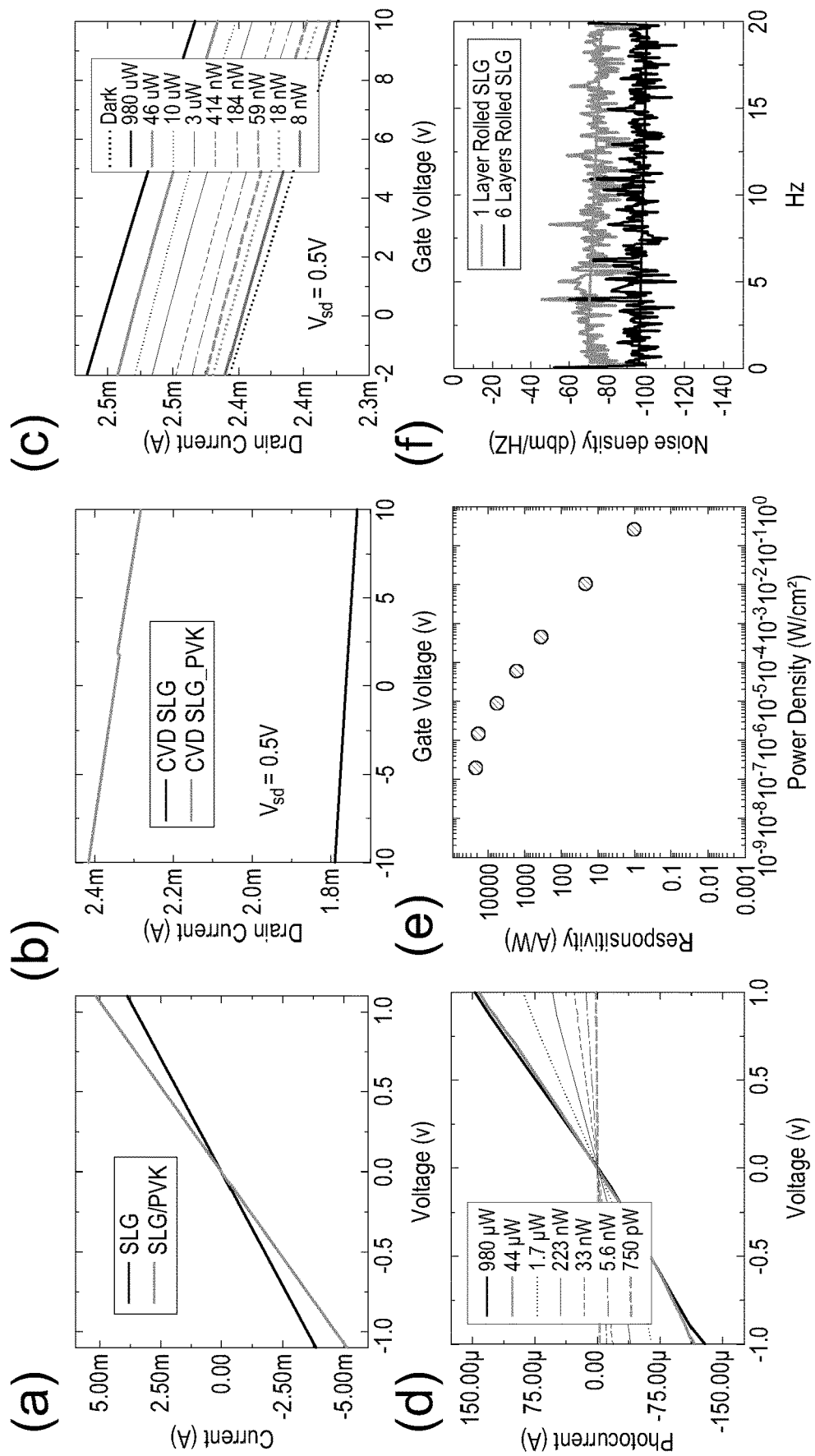
Figure 9:
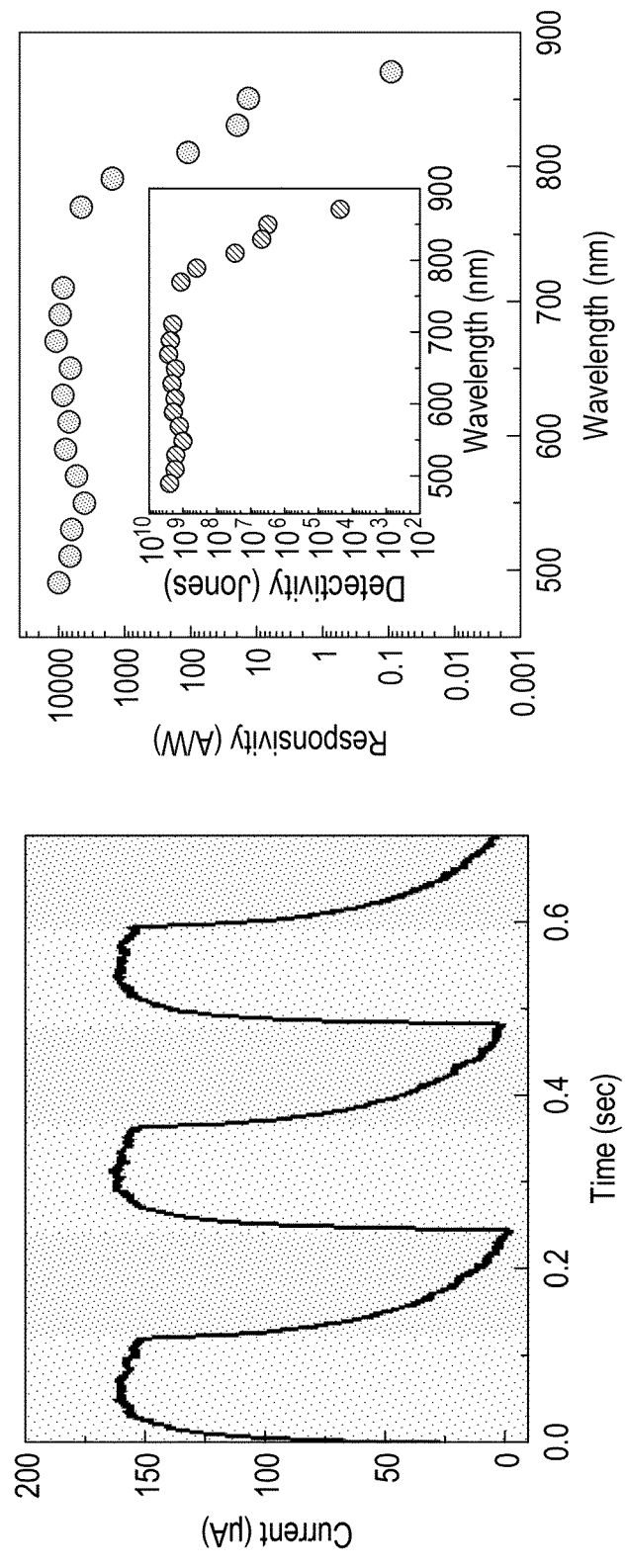

FIG. 6 illustrates in (a) atomic force microscopy of perovskite films formed on top of the rolled SLG channel shown in the optical microscopy image, (b) scanning electron microscopy image of perovskite film formed on the rolled graphene based phototransistor, (c) absorption spectra of pristine perovskite and hybrid graphene-perovskite films, (d) photoluminescence spectra of pristine perovskite and hybrid graphene-perovskite films upon excitation at 514 nm, (e) time resolved PL spectra of pristine perovskite and hybrid graphene-perovskite films at excitation wavelength of 400 nm;

FIG. 7 illustrates in (a) the source-drain current as a function of applied bias at dark condition before and after deposition of perovskite on channel layer, (b) the transconductance characteristics (Vsd=0.5V) of fiber based photodetector at dark condition, (c) Illumination power dependent transfer characteristics of the fiber based phototransistor at fixed wavelength of 488 nm, (c) corresponding drain photocurrent as a function of applied gate voltage, (d) photocurrent at Vg=+2V of the fiber based phototransistor as a function of applied bias at different illumination power, (e) corresponding external responsivity as a function of optical power;

FIG. 8 illustrates in (a) source-drain current as a function of applied bias at dark condition before and after deposition of perovskite on channel layer, (b) the transconductance characteristics (Vsd=0.5V) of fiber based photodetector at dark condition, (c) Corresponding drain photocurrent as a function of applied gate voltage, (d) photocurrent at Vg=0V of the fiber based phototransistor as a function of applied bias at different illumination power, (e) corresponding external responsivity as a function of optical power, (f) noise measurements for the fiber phototransistors with different rolling numbers (1 and 6 layers) of rolled SLG;

FIG. 9 illustrates in (a) temporal photocurrent response of the fiber based hybrid rolled graphene-perovskite photodetector under alternating dark and light illumination, (b) wavelength dependent photoresponse characteristics of fiber based hybrid graphene-perovskite phototransistor. Inset, shows corresponding detectivity of the device at each wavelength.

Figure 10:
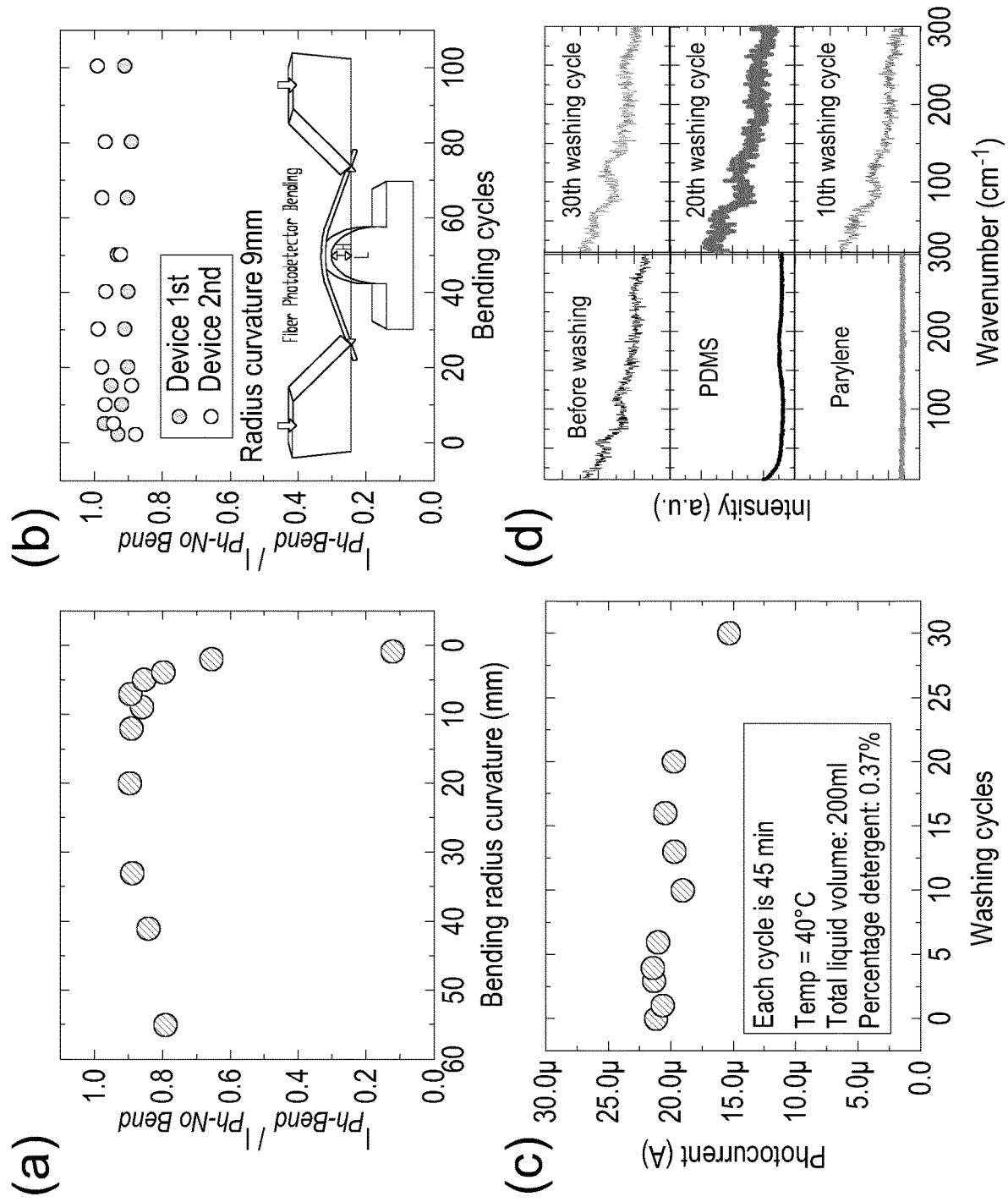

FIG. 10 illustrates (a) bending radius versus the change in the photocurrent normalized according to the photocurrent at the flat state. (b) device performance under different bending cycles. Inset shows a schematic illustration of a three-point bending setup of fiber based phototransistor. L indicates the chord of circumference connecting two ends and H is the height at the chord midpoint. (c) performance of the device at different number of washing cycles. Laundry washing were followed according to AATCC standard test procedures. After each cycle, device was dried and photocurrent values were measured. (d) Raman spectra of encapsulated perovskite at different washing cycles.

Figure 11:
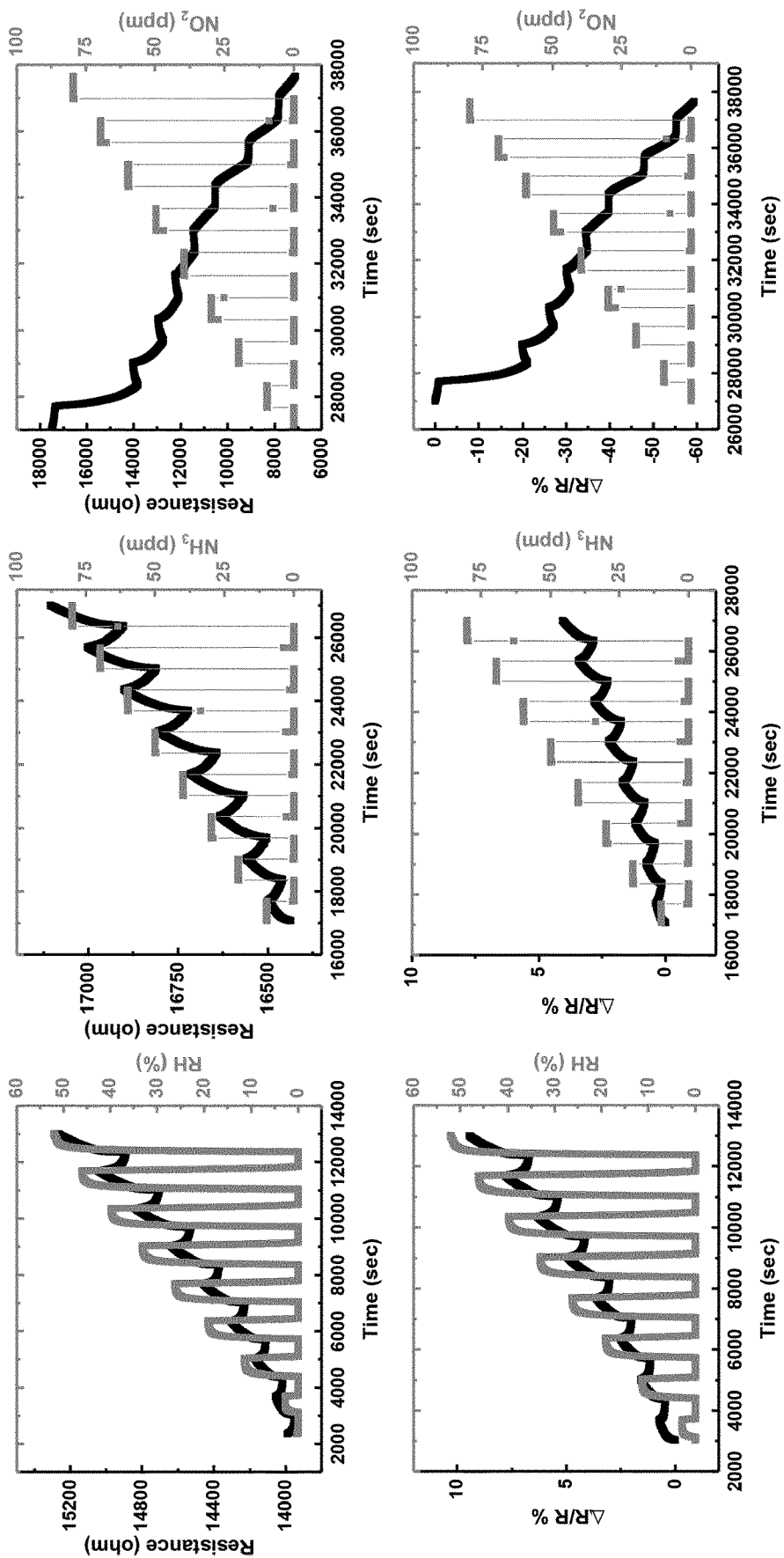
Figure 12:
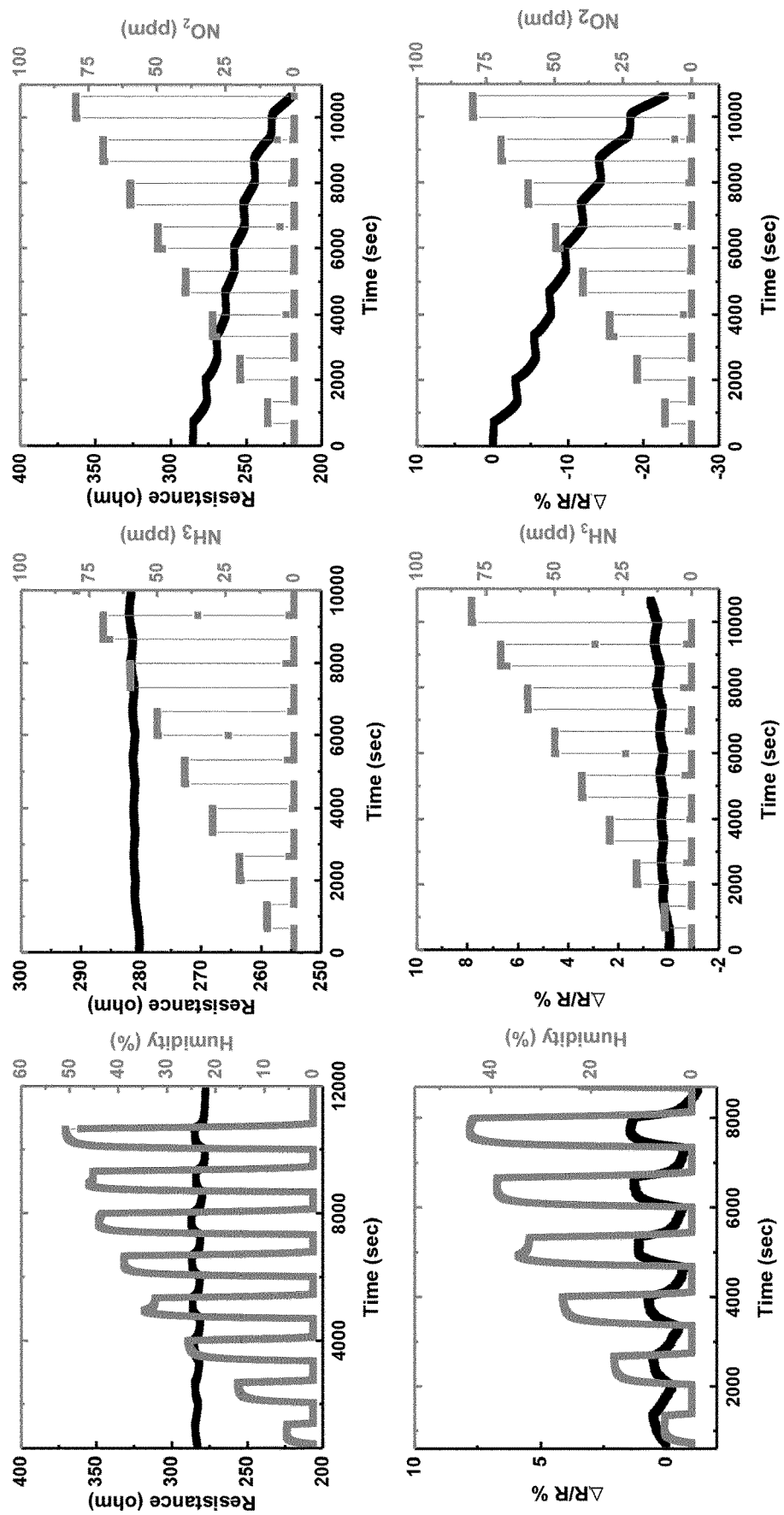
Figure 13:
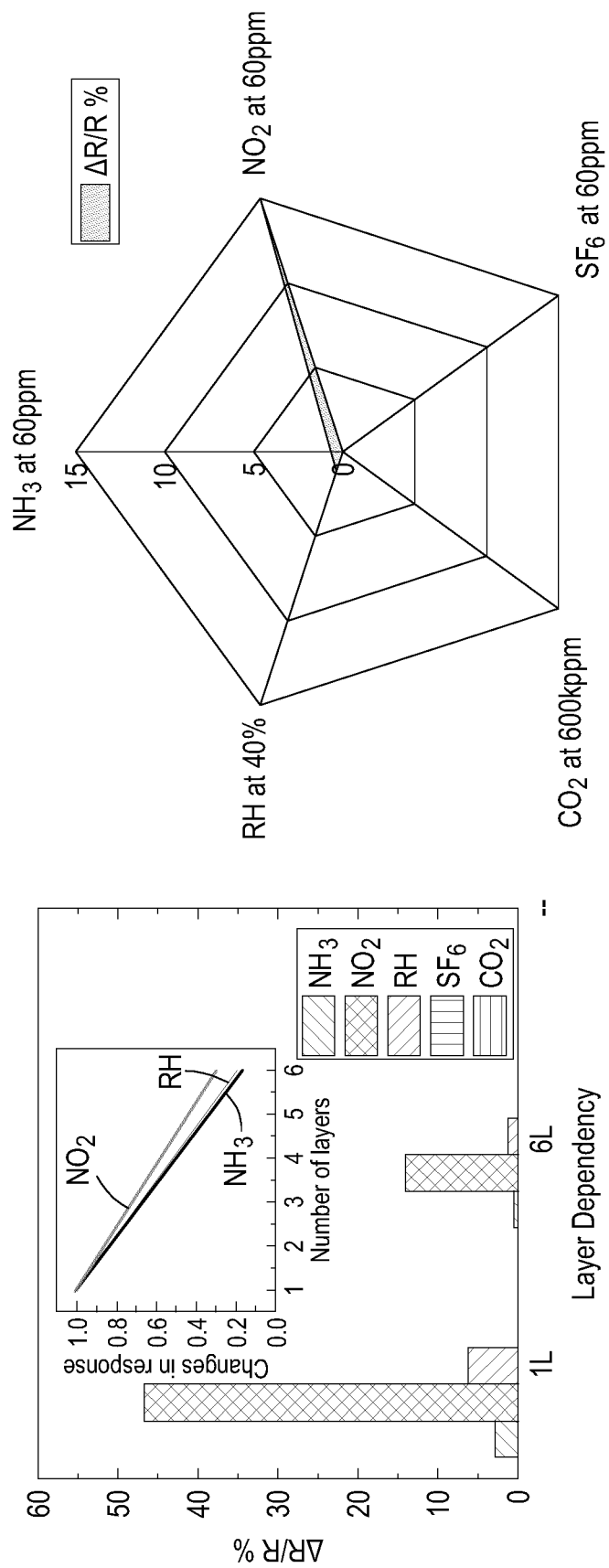

FIG. 11 illustrates a set of gas sensing experimental results for device having channel based on 1 layers rolled CVD SLG;

FIG. 12 illustrates a further set of gas sensing experimental results for device having channel based on 6 layers rolled CVD SLG; and FIG. 13 illustrates the dependency of number of layers on gas sensitivity and selectivity.

DETAILED DESCRIPTION OF THE FIGURES

Figure 1:
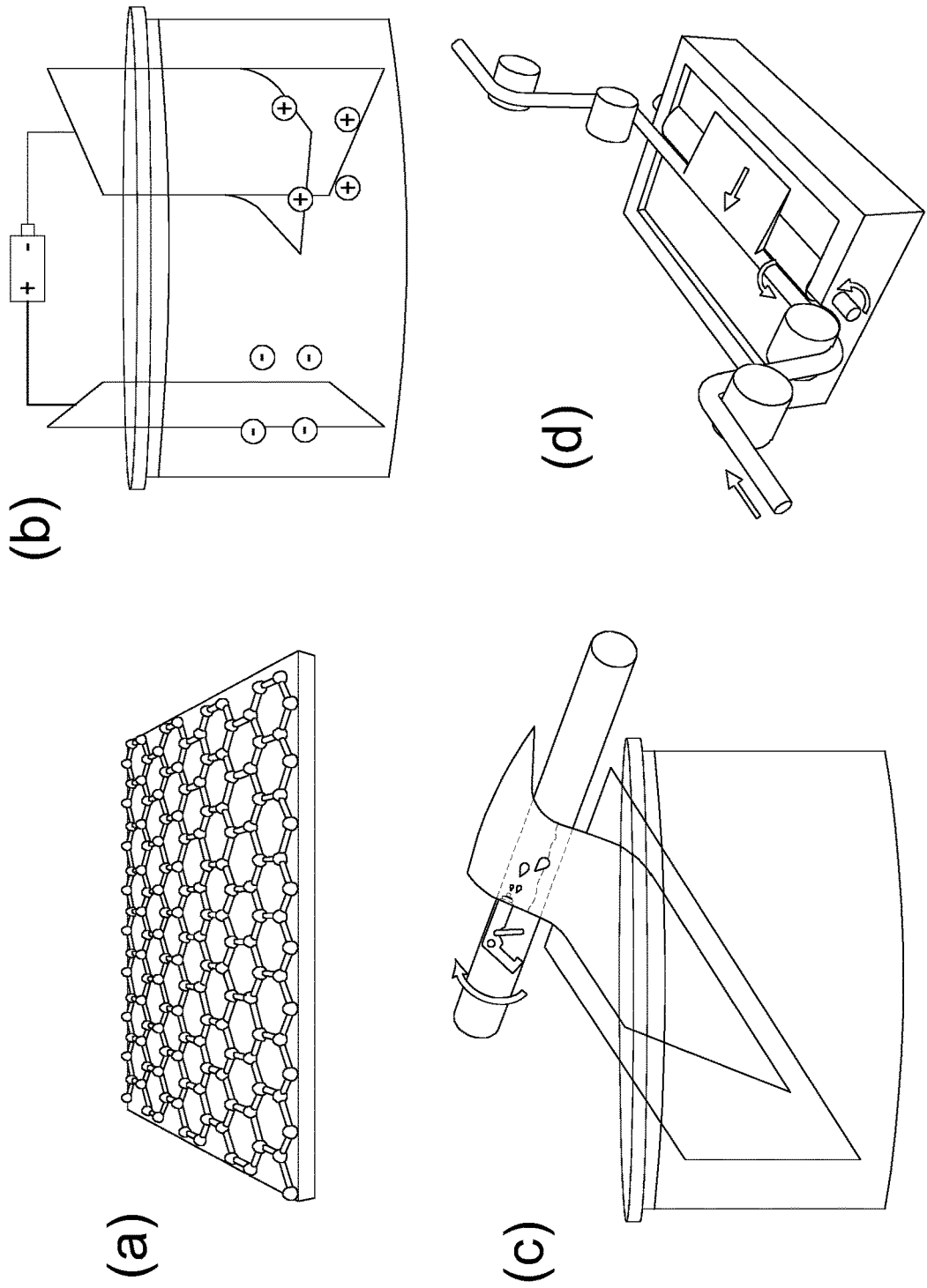
FIG. 1 is a schematic drawing of the method of the invention.

The preferred method of the invention is illustrated in FIG. 1. Referring to FIG. 1a, this shows a sheet of a first material, specifically a CVD single layer graphene sheet, on a copper support. In FIG. 1a, the sheet is shown without a protective film on top of the CVD single layer graphene sheet, but as described above, a protective film is preferably present. FIG. 1b shows a fast electrochemical delamination. The CVD single layer graphene sheet is made the cathode and a platinum sheet (not shown) the anode. The sheets are both immersed in an aqueous solution of potassium hydroxide (e.g. 0.1 M concentration) and a voltage (e.g. 1-2 V) is applied. Hydrogen bubbles generate at the surface and aid delamination from the copper support which typically occurs within 10-60 s. After washing the delaminated CVD single layer graphene sheet is placed in a liquid as shown in FIG. 1c. From the liquid, the CVD single layer graphene sheet is fished onto a transfer support. Typically this means that the transfer support is dipped into the liquid, underneath the CVD single layer graphene sheet so that the support is brought into contact with the graphene exposed by the electrochemical delamination process. Prior to bringing the CVD single layer graphene sheet into contact with the transfer support, preferably the fiber is laid across the top edge of the transfer support. Thus when the CVD single layer graphene sheet contacts the transfer support, it also contacts the fiber. Once the CVD single layer graphene sheet and transfer support, and preferably the fiber, are in contact, the structure is preferably lifted out of the liquid. Subsequent rolling of the fiber then causes the CVD single layer graphene sheet to slide along the transfer support and to roll around the fiber. The sliding motion preferably causes a slight stretching of the CVD single layer graphene sheet which means that it is wrinkle and crease free. The rolling of the fiber causes layers of CVD single layer graphene sheet to form on the fiber is a controlled manner. Advantageously the layers confirm to the shaper of the fiber. Additionally, due to the stretching that occurs, there are few, if any, wrinkles or creases, in the layers formed. Finally, FIG. 1d presents the scale up approach for continuous coating of the passing fibers with the floating layers on the move.

Figure 3:
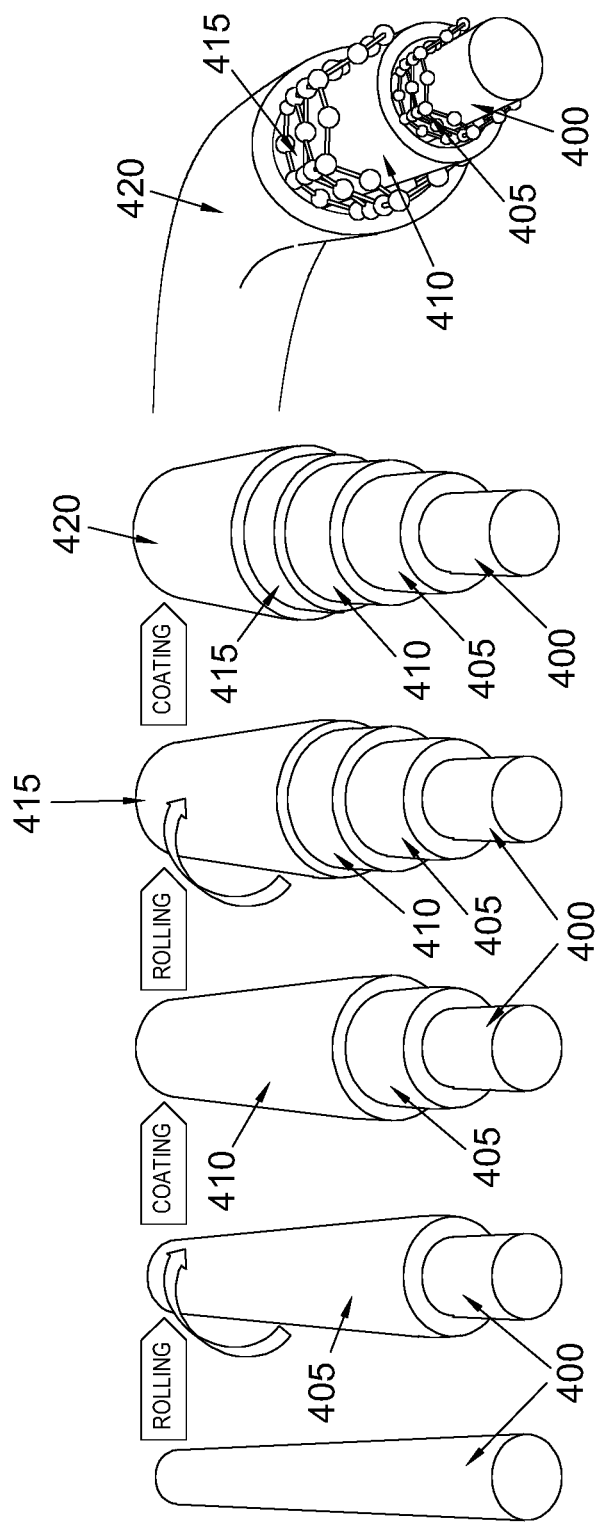
FIG. 3 illustrates a step-wise fabrication process of fiber-based hybrid rolled graphene-perovskite phototransistors.

FIG. 3 illustrates an example of a step-wise fabrication process of fiber-based hybrid rolled graphene-perovskite phototransistors or hetero-structures (inset image shows the rolled SLGs sandwiched in between the dielectric and perovskite layers). Although graphene is used in this example, other suitable materials as discussed in this specification can also be used instead of graphene. As can be seen in FIG. 3, a curved core fiber or a suitable curved material 400 is provided and then a single layer graphene 405 (or the first material) is rolled or wrapped around the core fiber 400. Then, in one example, a dielectric or insulation material 410 is formed on the wrapped graphene 405. After this, in one example, a further graphene layer 415 (or the second material) is wrapped around the dielectric material 410. A channel region is normally formed in second material or second graphene rolled layer 415. Finally, in one example, a photoactive material 420 is formed on the second rolled material (or graphene in one example) 415. In this example, the hetero-structure forms a phototransistor, but it will be appreciated that the same structure can be used as a sensing device, such as a gas sensing device.

Figure 4:
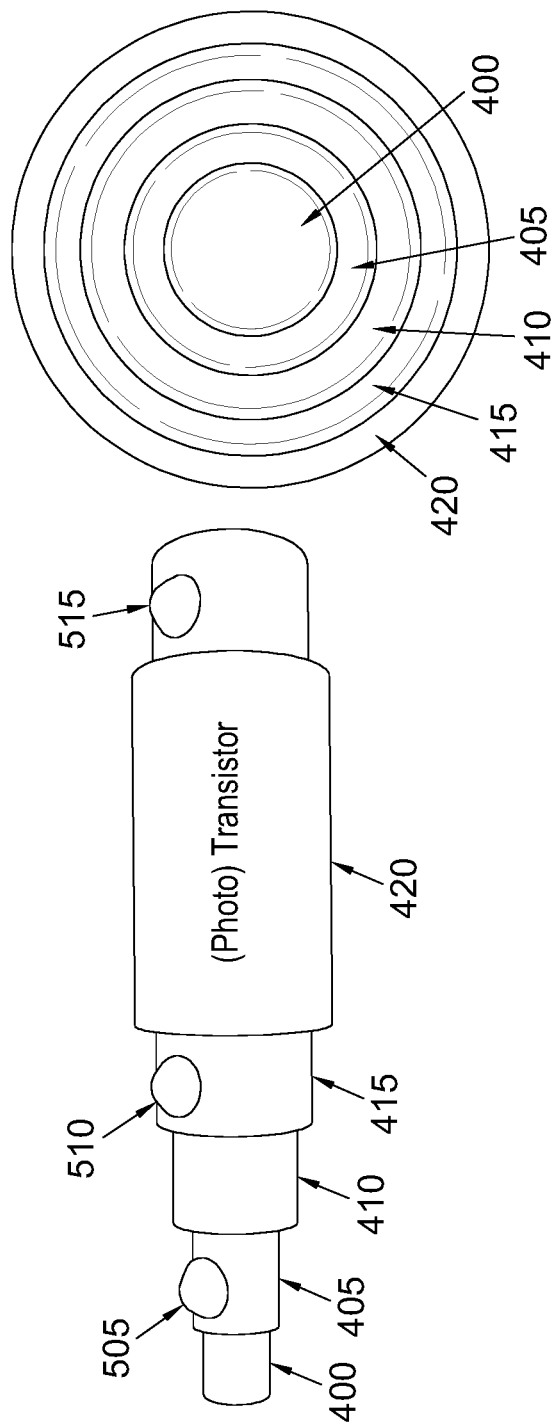
FIG. 4 illustrates a schematic representation of a phototransistor and/or a sensing device.

FIG. 4 illustrates a schematic representation of a phototransistor and/or a sensing device. Many features of the device of FIG. 4 are the same as those shown in FIG. 3 and therefore carry the same reference numbers. However, in the device of FIG. 4, gate 505, drain 510 and source 515 contacts are provided. Drain 510 and source 515 are formed on the second rolled material (e.g. graphene) 415 and the photoactive material 420 is located between the drain 510 and source 515. The gate contact 505 is formed on the first rolled material (e.g. first graphene rolled layer) 405.

Figure 5:
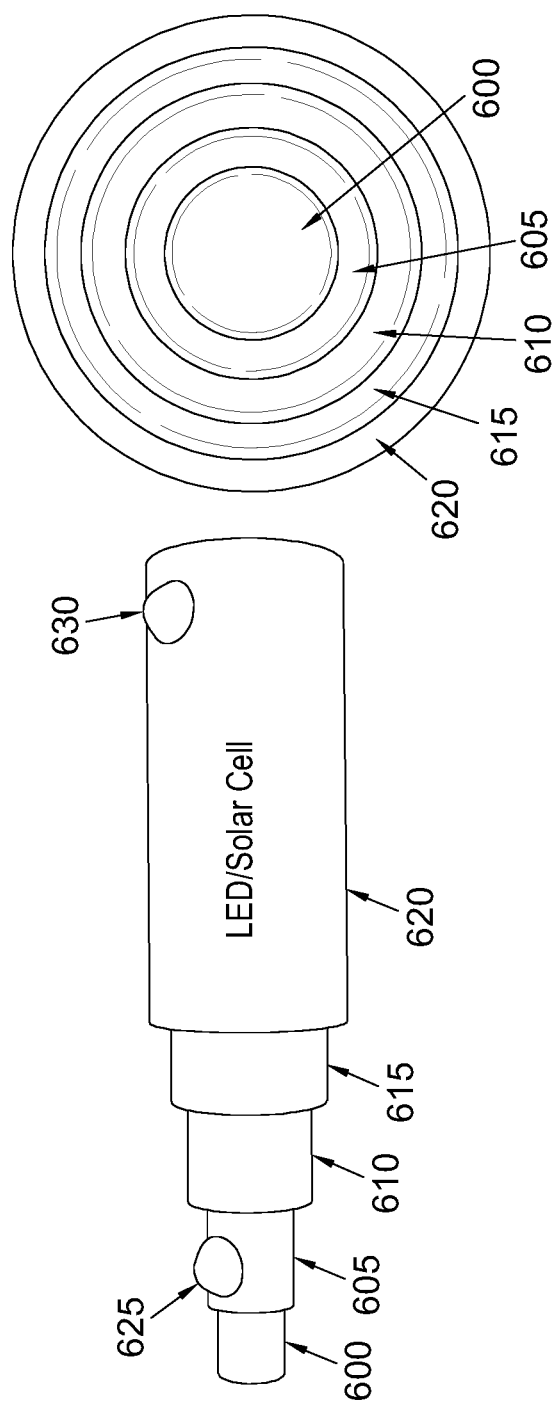
FIG. 5 illustrates a schematic representation of a light emitting diode (LED) and/or solar cell.

FIG. 5 illustrates a schematic representation of a light emitting diode (LED) and/or solar cell. The device includes a core fiber 600 and a first material (e.g. a first graphene layer) 605 rolled around the core fiber 600. A hole transport layer 610 is formed on the first rolled material 605 and a photoactive material 615 is formed on the hole transport layer 610. A second rolled material (e.g. a second graphene layer) 620 is wrapped around the photoactive material 615. A first (bottom) electrode 625 is formed on the first rolled material 605 and a second (top) electrode 630 is formed on the second rolled material 620. This hetero-structure can be used as a LED and/or a solar cell device.

Materials:
PMMA-coated single layer graphene (SLG) on a copper support was obtained from Sigma-Aldrich or Fisher Scientific;
Ammonium persulfate (APS) was obtained from Sigma-Aldrich or Fisher Scientific;
Glass fiber was obtained from Sigma-Aldrich or Fisher Scientific;
Transfer supports made of each of PET, PEN, quartz and glass were obtained from Sigma-Aldrich or Fisher Scientific.

Characterisation Methods
Scanning electron microscopy (SEM) was carried out using High Resolution SEM Magellan;
Optical microscopy was carried out using Thorlabs equipped microscope;
I-V measurements for device characteristics was carried out using Keithley 2612B.
Temporal photocurrent response measurements were carried out using Keysight oscilloscope.
The AFM measurement were performed in a Bruker Dimension Icon with a scanning rate of 0.972 Hz in a tapping mode.
The Raman measurement were performed via a Horiba Jobin Yvon HR800 spectrometer equipped with a 50× objective. The laser power is kept below 100 μW.

Methods
Delamination of PMMA-coated SLG
(i) Chemical Etching
3×6 cm CVG grown graphene on copper (both sides) was sliced into 1×1 cm pieces, PMMA was then spin coated onto the top side at 4000 rpm for 40 s to produce protective coatings, ~400 nm in thickness. Afterwards, oxygen plasma was used to remove any excess graphene from the backside of the copper. The pieces were then submerged in 150 ml of aqueous ammonium persulfate solution ($(NH_4)_2S_2O_8$, 0.5 mol/L) for 2 hours at 25° C. for complete copper dissolution. The resulting free-standing PMMA-coated graphene layers were washed according to the procedure described below.

(ii) Electrochemical Delamination
A two-electrode system was used, with the PMMA-coated graphene sheet as the cathode (negatively charged) and a platinum sheet as the anode (positively charged). The system was submerged in a 0.1 M aqueous solution of KOH, and a voltage of 1-2 V was applied. The average current was 0.1-1 mA/cm$^2$. Hydrogen bubbles formed at the copper-graphene interface and facilitated the mechanical delamination the graphene from the copper support. After complete delamination, which typically took 10-60 s, the free-standing PMMA-coated graphene was then washed according to the procedure described below.

After delamination by either chemical etching or electrochemical delamination, the free-standing PMMA-coated graphene sheets was then cleaned by dipping in fresh deionised water for 20 minutes, either 2 or 3 times.

Fishing and Rolling onto a Fiber, Including Removal of the Protective Film

The rolling process consisted of two main steps. First, the edge of the PMMA-coated graphene sheet was "grabbed" by the top of the glass fiber (125 micron diameter with 1 cm target length coverage). Specifically, the fiber was placed on top of the transfer support and a top edge of the floating graphene sheet was fished onto the fiber. The remainder of the graphene sheet lies on the surface of the transfer support. Second, and after waiting for a few seconds for the graphene sheet to dry, the fiber was rotated at speeds ranging from 1-10 rpm. The rotation of the fiber slides the graphene sheet along the transfer sheet and onto the rotating surface of the fiber. The sheet is stretched in the process and as a result the graphene layers formed on the fiber are wrinkle-free and crease-free and show a high level of conformity with the fiber.

A different number of layers was rolled depending on the end application of the fiber. After reaching the desired level of rolling, the sheet was cut by pulling it away from the transfer support.

Figure 2:
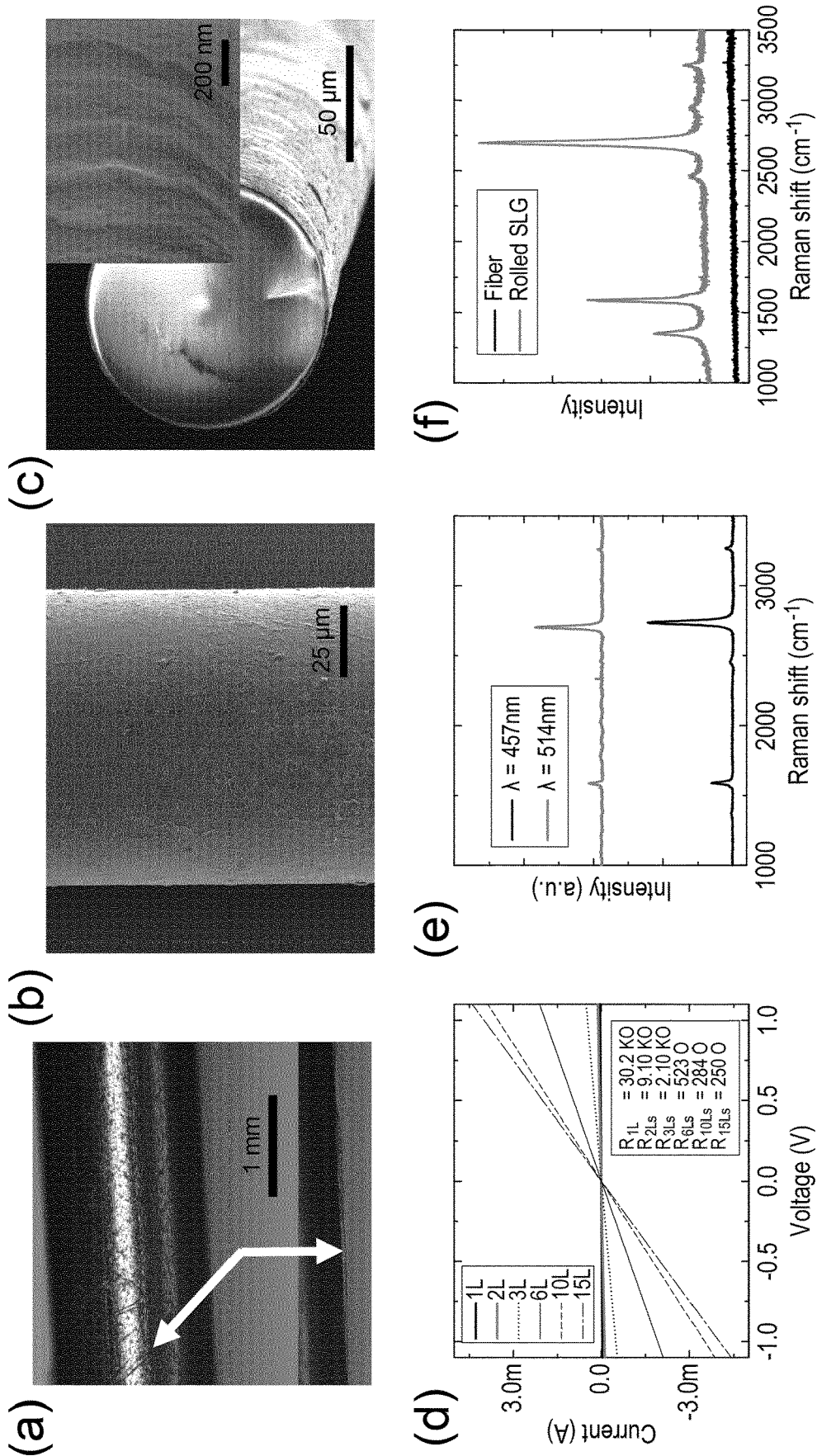
FIG. 2 shows (a) an optical microscopy image, (b,c) SEM images of transferred CVD SLG around a glass fiber, (d) conductivity versus number of rolled CVD SLG and (e,f) Raman characteristics of CVD SLG before and after transfer.

Finally, the PMMA-coating on the graphene was removed by immersing the coated fiber in acetone for 15 min followed by rinsing with isopropanol for at least 10 min and drying under $N_2$ gas flow. Annealing at 300° C. can be carried out to ensure the complete removal of any residues. FIG. 2 shows scanning electron microscopy and optical microscopy images of single layer graphene rolled around a sample fiber.

Device Fabrication Process

The following description is discussed as examples of implementations of the hetero-structure described above.

The demonstrated transfer process is utilized to fabricate the main components (gate and channel) of large-area and flexible field effect transistors (FETs). Moreover, the source and drain electrodes are generally made by inkjet printing technology using silver nanoparticle inks. Referring to FIG. 3 again, this presents a step-wise fabrication schematic of the FET devices which are used to construct the rolled CVD SLG-perovskite hybrid phototransistors around fibers. Rolled CVD SLG (e.g. 6 times) was employed as the gate electrode. Then, 150 nm of $Al_2O_3$ plus 200 nm Parylene C were deposited as the dielectric layer. $Al_2O_3$ deposition was performed using atomic layer deposition (ALD), which offers high conformity.

During the preliminary experiments, the sole use of $Al_2O_3$ as dielectric resulted in a premature failure due to various mechanical stress/strain applied to the sample throughout the device fabrication process. To address this, an additional conformal coating of 200 nm pin-hole-free Parylene C was applied via SCS parylene coater. Use of Parylene as a reliable dielectric choice is reported with promising prospects for flexible electronics. Since Parylene C is applied as gas and evaporated at ambient temperature under vacuum, it ultimately covers all the available surfaces, providing complete and uniform encapsulation. Consequently, this step further improved the dielectric robustness against deformations during manufacturing and significantly reduced the risk of short circuit.

Afterwards, in one example, another CVD SLG was rolled as the channel material followed by printing silver contacts to establish source and drain of the device (channel length for example: 1000 μm width: 120 μm). Without any lithography step (typically done for channel patterning), in one example, a state of the art $CH_3NH_3PbI_3$ perovskite was deposited via a simple spin coating procedure on top of the rolled CVD SLG surface. The resulting film yielded in a uniform coverage with an average roughness of 20 nm obtained by atomic force microscopy (AFM) (FIG. 6a). SEM image of perovskite films on rolled CVD SLG is displayed in FIG. 6b. Moreover, FIG. 6c depicts the absorption spectra of perovskite, SLG and hybrid SLG-perovskite systems. The steady state photoluminescence (PL) spectra of the perovskite and hybrid SLG-perovskite configurations (on quartz substrates) are shown in FIG. 6d. Under the same experimental conditions, both perovskite and hybrid SLG-perovskite exhibited PL peak at ~762 nm arising from the perovskite band gap. However, the PL quantum yield of pristine perovskite is higher than SLG-perovskite hybrid. In other words, the PL intensity (integrated area under the curve) of the SLG-perovskite with respect to perovskite itself was quenched by nearly 96%.

Such a significant PL quenching could be attributed to effective charge carrier transfer between perovskite and graphene layer. To explore this further, time resolved PL analysis was done at ambient temperature (FIG. 6e) which indicates faster decay time in the case of hybrid SLG-perovskite compared to pristine perovskite; which confirms the transfer of charges from perovskite to graphene.

Photo-Response Characterisation

In the next step, the photoresponse characteristics of the fabricated phototransistors were investigated. In all devices, at least 6 layers of graphene were rolled as the gate electrode. By controlling the rolling process, the effect of layer dependency in case of graphene as the channel material was investigated. To begin with, 1-2 layers SLG rolling was explored. The linear dependency of current to voltage indicates the low ohmic contact of the electrodes with the channel layer, see FIG. 7a. By depositing perovskite on top of the graphene-based channel, the current values increase suggesting the transfer of holes from perovskite to the channel layer. Similarly, the transconductance curves of as fabricated fiber phototransistors without illumination are displayed in FIG. 7b before and after perovskite deposition. The gate voltages in the range of −2V to 2V were applied here to avoid the dielectric breakdown. In graphene-only devices, the charge neutral point emerged in larger positive gate voltages according to the drain current modulation. This reveals a p-doped channel behaviour; typically caused by water trapping (or absorption) underneath (or above) the rolled SLG layer. The drain current regime for the rolled SLG-perovskite transistor is similar to that of graphene-only versions though with a major shift to higher gate voltages. This could suggest that p-doping effect in pristine graphene is strengthened due to the hole transfer from perovskite to the hole dominated graphene channel. This is consistent with FIG. 7a which presents source-drain current as a function of applied bias. The increase of hole current in the graphene channel further confirms the transfer of holes (electrons) from perovskite (graphene) to graphene (perovskite).

FIG. 7c demonstrates transconductance measurements (drain current vs gate voltage) under different light intensities at 488 nm. In one example, all measurements were conducted at a fixed drain voltage of 0.5V where the black line indicates the dark current. Due to the ultrafast charge re-combination in graphene, the photo-generated carriers do not contribute to the observed photocurrent. As shown in FIG. 7c, the drain current under illumination shifted towards more positive gate voltages. This is attributed to the additional gating effect generated by the photo-excited electrons in perovskite. The resulting electron-hole pairs combined with the existing holes in perovskites valence band are transferred to graphene (i.e., electron transfer from graphene to perovskite); inducing a hole current in graphene channel through capacitive coupling. This is generally in agreement with the quenched PL intensity measured in hybrid SLG-perovskite (FIG. 6c).

Moreover, FIG. 7d suggests that higher photocurrents can be achieved by increasing the gate voltage to +2V. Elevating gate voltages induces further p-doping in graphene channel resulting in a strong electric field at the graphene-perovskite junction; which favours hole transfer to SLG. Consequently, larger photocurrents are observed at elevated gating due to increased transfer rate of the photo-generated holes.

The photocurrent ($I_{ph}=I_{light}-I_{dark}$) of the fiber-based hybrid devices at $V_g$=+2V is summarized in FIG. 7e under different illumination intensities. These values were obtained by sweeping drain voltage from −1 to 1V. Consistent with the above-mentioned photo-gating mechanism, the illumination power rise leads to higher photocurrents. A larger number of photo-generated electrons at higher illumination power are trapped in the perovskite inducing more negative voltages within the hybrid structure. The corresponding external responsivity as a function of illumination intensity is displayed in FIG. 7f. External responsivity is defined as $R_{ext}=(|I_{sight}-I_{dark}|)/(Popt.APD/A_0))$ where $I_{light}$ and $I_{dark}$ are the device current under illumination and in the dark, respectively, $P_{opt}$ is the impinging optical power and $APD/A_0$ is a scaling factor to take into account the active device area. Subsequently, for example, the fiber-based hybrid phototransistor exhibited external responsivity up to 376 A/W under illumination power of 750 pW and applied bias of 1 V. Photoconductive gain can be estimated as the ratio between $\tau_{life}$ (excess carrier lifetime) to $\tau_{transit}$ (transit time). For higher voltage applied across the source and drain ($V_{sd}$), the free carriers drift velocity $V_d$ in graphene channel increases lineally until reaching saturation caused by the carrier scattering with optical phonons. Since $t_{tr}=L/V_d$ where $t_{tr}$ is transit time and L is the channel length, the increase in drift velocity ($V_d$) results in shorter transit time ($t_{tr}$). Thus, photoconductive gain is generally expected to grow linearly with $V_{sd}$, results in higher external responsivity. Therefore, all measurements were done at $V_{sd}$=1 V to keep the device operation in the linear (ohmic) regime thus eliminating the nonlinear dependence of $V_d$ on $V_{sd}$.

Next, for example, the number of rolled graphene for the channel was increased to 6 layers while all other conditions (dielectric and gate electrode were kept similar). The experiments for the as-fabricated devices in the absence of light are presented in FIG. 8a, b. Similar to the previous device, there is increasing in the drain current and gate voltage shifted to the right after deposition of perovskite on graphene-based channel layer. This variation is attributed to the change in graphene's Dirac point; which generally suggests that the p-type doping in graphene is strengthened due to transfer of holes from perovskite to graphene.

In one example, the power dependent transconductance measurements at 488 nm under drain voltage of 0.5 V are presented in FIG. 8c. According to the results, the drain current increased under light illumination and shifted to higher gate voltages. The photo-generated charges are separated at the graphene-perovskite interface due to the electric field buildup. The holes are transferred to the graphene sheet while electrons are trapped in perovskite creating the photo-gating effect. Consequently, larger photocurrents were generally observed in 6 layer rolled SLG-perovskite phototransistors compared to those of on 1-2 layers SLG configurations.

FIG. 8d shows the photocurrent at zero gate voltage and sweeping drain voltage between −1 to 1 V under different illumination intensities. The corresponding responsivity shows extremely high value of 22000 A/W at 1V at 488 nm with a power of 750 pW as shown in FIG. 8e. To further characterize the device, the detectivity was recorded. The measured noise in the dark current shows a strong 1/f component in FIG. 8f. Considering the measurement at 1 Hz frequency, this leads into a noise equivalent power of $7.9\times10^{-9}$ W/Hz$^{1/2}$ with the corresponding detectivity of $10^7$ jones (cm·Hz$^{1/2}$/W) for phototransistor based on one layer rolled SLG. Similarly, the noise measurement for the phototransistor based on 6 layers rolled SLG were applied, resulted in noise equivalent power of $2.8\times10^{-10}$ W/Hz$^{1/2}$ with the corresponding detectivity of $10^6$ jones (cm·Hz$^{1/2}$/W). The noise current in the shot noise limit scales as in =(2 qIdB)$^{1/2}$, where B is the electrical bandwidth, q is the electron charge and Id is the dark current in the device. As a result, the directivity in our device based on the shot noise limit can be expressed as D*=R(AB)$^{1/2}$/in where A is the active area of the device, B is the electrical bandwidth, and R is the external responsivity. The shot noise limited detectivity were calculated as $10^{12}$ and $10^{13}$ jones for one layer rolled SLG and 6 layers rolled SLG phototransistors, respectively.

Generally speaking, the obtained responsivities for this hybrid device are seven orders of magnitude higher than pristine graphene (1 mA/W) and four orders of magnitudes higher than pristine perovskite (3 A/W). Such an unprecedented performance is a product of an effective charge transfer and photoconductive gain mechanism. The photoconductive gain can be calculated as follow; $G=\tau_{life}/\tau_{transit}=(\tau_{life}/[L^2/\mu V_{sd}])$; where G stands for photoconductive gain, $\tau_{life}$ is excess carrier lifetime, $\tau_{transit}$ is transit time, L is the channel length, μ is the mobility of the channel and $V_{sd}$ is the voltage applied between source and drain.

To calculate the $\tau_{life}$, the temporal photocurrent response of graphene-perovskite was measured in FIG. 9a. The results reveal that a rise time of 5 ms and a fall time less than 35 ms can be achieved without applying short gate pulses; which make the fabricated fiber device suitable for image sensing applications. Gain values in the range of at $V_{sd}$=1V were obtained at different optical powers at 488 nm. FIG. 9b presents the spectral responsivity of the hybrid SLG-perovskite photodetector ranging from visible up to 870 nm (near infrared). This photoresponse spectra closely follows the intrinsic absorption of graphene/perovskite films shown in FIG. 9 highlighting the role of perovskite as a strong light absorbing layer in which photoexcited charged are mainly produced.

Device Stability and Resilience

Finally, as an example, the robustness and stability of the as-prepared fiber photodetectors were examined via torturous mechanical bending and washability tests. The inset in FIG. 10a shows the variation in the photocurrent at different bending radius. Inset in FIG. 10b depicts the schematic of the three-point bending setup (Deben Microtest) where the photocurrent is measured as a function of bending cycles. In this configuration, the bending radius ($R_b$) is calculated by the following formula $R_b=[H^2+(L/2)^2]/2H$ where H is the height at the chord midpoint and L is the chord of circumference connecting two ends of the arc. The photocurrent was first measured at a flat position (no bending), and the device was then bent up to 9 mm radius curvature for 100 bending cycles (FIG. 10b). The steady ratio of bending to flat as a function of bending cycles suggests a stable performance after 100 bending tests with standard deviation of 0.02.

Afterwards, the washability of the samples was investigated as one of the main criteria for applications in the electronic textiles. For this, AATCC test protocol was carefully followed as suggested by numerous studies on e-textiles. Here, two encapsulation techniques were explored to protect the device during washing tests (mainly polymer-based). Initially, the fibers were conformally coated with a thin layer of Parylene C (1 μm); known as an excellent moisture barrier with high thermal (melting point 563 K) and UV stability while being biocompatible. The device was then coated further with polydimethylsiloxane (PDMS) for further waterproofing and resistance against harsh tension/compression introduced during washing. For this, the elastomer base and the curing agent were mixed with 1:0.1-1 ratios and spread on top of the fiber with 0.1-1 mm thickness. The samples were then cured at 80° C. for 30 minutes to harden the polymer coating before placing in the washing machine (SKYLINE rotate washing color) at 40° C. for 30 washing cycles, each programmed for 45 min. The samples were drip dried in a ventilated oven afterwards and tested for photo-responsivity. As shown in FIG. 10c, the devices were still functional after 30 washing cycles with slight drop in the photocurrent compared to the initial value (less than 20%) upto $30^{th}$ cycles. This could be attributed to the gradual degradation of the electrodes during extensive washing. Also, Raman investigation of encapsulated perovskite at different washing cycles was conducted, shown in FIG. 10d. As it can be seen, no degradation of perovskite to $PbI_2$ was monitored at any washing cycles, confirming the robustness of our proposed encapsulated layer. Furthermore, Parylene C emerged as the integral part of the device encapsulation/protection owing to its transparency and flexibility towards effective sealing of the devices and their accompanying components.

Gas Sensing Performance

FIG. 11 presents a series of graphs demonstrating the high sensitivity of the 1-2 layers rolled SLG towards various gases at room temperature. It also confirms that the same device architectures depicted in FIGS. 3-4 are capable of sensing different gases. The graphs show a significant correlation between ohmic resistance (or its change in %) of the rolled SLG against various gases at different concentration levels including relative humidity (RH %), ammonia ($NH_3$) and nitrogen dioxide ($NO_2$).

FIG. 12 shows similar testing performed with the 6 layers of rolled SLG as the channel. The notable observation is the high selectivity towards $NO_2$ with a dramatic decrease of sensitivity to RH % and $NH_3$.

FIG. 13 compares the above described trends observed in the 1 layer and 6 layer rolled SLGs for relative humidity (RH %) at 60%, carbon dioxide ($CO_2$) at 600,000 ppm and ammonia ($NH_3$), sulphur hexafluoride ($SF_6$) and nitrogen dioxide ($NO_2$) at 60 ppm. This graph further demonstrates the high sensitivity of the SLG with few layers and the high selectivity of the SLG towards nitrogen dioxide as the number of layers is increased. Inset on this graph presents the relative change in response towards the aforementioned gases as the number of layers increases.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A hetero-structure comprising:
   a curved material, the curved material comprising a core comprising a polymer;
   at least one layer of a first material rolled around the curved material;
   at least one intermediate layer rolled on the at least one layer of the first material; and
   at least one layer of a second material rolled around the at least one intermediate layer,
   wherein at least one of the first and second materials comprises graphene, boron nitride, and/or a transition metal dichalcogenide.

2. A hetero-structure according to claim 1, wherein the curved material comprises a fibre comprising glass, metal, carbon, nylon, polyester, cotton wools or a mixture thereof.

3. A hetero-structure according to claim 1, wherein the first and second materials each comprise an electrically conducting material.

4. A hetero-structure according to claim 1, wherein at least one of the first and second materials comprises chemical vapour deposition (CVD) or physical vapour deposition (PVD) single layer graphene (SLG).

5. A hetero-structure according to claim 1, wherein the first material comprises a plurality of rolled layers, and wherein the second material comprises a plurality of rolled layers, and/or wherein the first material comprises at least six layers rolled on top of one another, and wherein the second material comprises any of one to six layers rolled on top of one another.

6. A hetero-structure according to claim 1, wherein the at least one intermediate layer is an insulation layer, and/or wherein the at least one intermediate layer comprises a mixture of aluminium oxide ($Al_2O_3$) and a conformal coating of pin-hole-free Parylene C.

7. A hetero-structure according to claim 6, wherein the at least one layer of the first material is configured to operate as a gate region and the at least one layer of the second material is configured to operate as a channel region.

8. A hetero-structure according to claim 6, further comprising a photoactive material located on a channel region, and/or wherein the photoactive material comprises a doped perovskite solution.

9. A hetero-structure according to claim 6, wherein the hetero-structure is a gas sensing device, wherein the gas sensing device is configured to detect a gas by detecting a change in resistance of the channel region.

10. A hetero-structure according to claim 6, wherein the hetero-structure is a phototransistor.

11. A hetero-structure according to claim 1, wherein the at least one intermediate layer comprises a plurality of semiconducting layers, wherein the plurality of semiconducting layers comprise a hole transport layer and a photoactive layer over the hole transport layer.

12. A hetero-structure according to claim 11, further comprising a first electrode disposed on the at least one layer of the first material and a second electrode disposed on the at least one layer of the second material.

13. A hetero-structure according to claim 11, wherein the hetero-structure is a light emitting diode (LED) or a solar cell.

14. A hetero-structure according to claim 1, wherein the hetero-structure is an imaging sensor or an ultraviolet (UV) detector or a strain sensor, or an actuator, or an optic coupler.

15. A rolled device comprising the hetero-structure according to claim 1.

16. A method of depositing one or more layers of a first material on a fiber, the fiber comprising a core comprising a polymer, the method comprising:
   (i) providing a sheet of the first material in a liquid, wherein the sheet of the first material comprises graphene, boron nitride, and/or a transition metal dichalcogenide;
   (ii) fishing the sheet of the first material out of the liquid and onto a transfer support;
   (iii) transferring the sheet of the first material from the transfer support onto the fiber by rolling the fiber; and
   (iv) optionally cutting the sheet of the first material.

17. A method as claimed in claim 16, wherein said fiber comprises a polymer, glass, metal or a mixture thereof.

18. A method as claimed in claim 16, wherein said sheet of first material comprises an electrically conducting material.

19. A method as claimed in claim 16, wherein said sheet of first material comprises a protective film.

20. A method as claimed in claim 16, further comprising the step of providing a sheet of the first material on a support and removing the material from the support.

21. A method as claimed in claim 16, wherein said liquid has a surface tension of 10-100 mN/m, and/or wherein said transfer support and said liquid has a contact angle of 20-50°.

22. A method as claimed in claim 16, wherein said transfer support comprises polyethylene terephthalate (PET), polyethylene naphthalate (PEN) or glass, and/or wherein a plurality of layers of first material is deposited on the fiber by rolling the fiber.

23. A method as claimed in claim 16, wherein a layer of a second material is deposited on top of the first material, and/or wherein a further layer of said first material is deposited on top of said second material by repeating steps (i)-(iv).

24. An article or a device comprising a fiber obtainable by the process of claim 16.

* * * * *